US012740055B2

(12) United States Patent
Kim et al.

(10) Patent No.: US 12,740,055 B2
(45) Date of Patent: Sep. 15, 2026

(54) SEMICONDUCTOR DEVICE

(71) Applicant: SAMSUNG ELECTRONICS CO., LTD., Suwon-si (KR)

(72) Inventors: Kyunghwan Kim, Suwon-si (KR); Hyungeun Choi, Suwon-si (KR); Keunnam Kim, Suwon-si (KR); Seokhan Park, Suwon-si (KR); Seokho Shin, Suwon-si (KR); Joongchan Shin, Suwon-si (KR); Kiseok Lee, Suwon-si (KR); Sangho Lee, Suwon-si (KR); Moonyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/518,293

(22) Filed: Nov. 22, 2023

(65) Prior Publication Data

US 2024/0172428 A1 May 23, 2024

(30) Foreign Application Priority Data

Nov. 22, 2022 (KR) ........................ 10-2022-0157645

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC ...... H10B 12/50; H10B 12/09; H10B 12/315; H10B 12/34; H10B 12/482; H10B 12/053; H10B 53/40
USPC .......................................................... 257/296
See application file for complete search history.

(56) References Cited

U.S. PATENT DOCUMENTS 11,217,588 B2 1/2022 Sukekawa et al.
2010/0197121 A1* 8/2010 Kim .................... H10D 30/025 257/E21.133
2010/0203695 A1* 8/2010 Oh ........................ H10D 86/01 438/270
2011/0101445 A1* 5/2011 Kim ........................ H10P 90/00 257/784
2011/0220977 A1* 9/2011 Yoon ...................... H10B 12/00 257/E21.409
2011/0223725 A1* 9/2011 Kang ................. H10P 90/1916 438/151

(Continued)

FOREIGN PATENT DOCUMENTS

KR 10-2014-0046698 4/2014
KR 10-2021-0012710 2/2021

*Primary Examiner* — Norman D Richards
*Assistant Examiner* — Laura M Dykes
(74) *Attorney, Agent, or Firm* — Morgan, Lewis & Bockius LLP

(57) ABSTRACT

A semiconductor device is provided. The semiconductor device includes: a lower structure including a bit line; a cell semiconductor body vertically overlapping the bit line, on the lower structure; a peripheral semiconductor body including a portion disposed on a same level as at least a portion of the cell semiconductor body, on the lower structure; and a peripheral gate on the peripheral semiconductor body, wherein the peripheral semiconductor body includes a lower region having a first width and an upper region having a second width, greater than the first width on the lower region.

20 Claims, 28 Drawing Sheets

(56) References Cited

U.S. PATENT DOCUMENTS

| | | | | |
|---|---|---|---|---|
| 2012/0052635 | A1* | 3/2012 | Kang | H10D 30/025 438/151 |
| 2014/0097519 | A1 | 4/2014 | Cho et al. | |
| 2020/0381557 | A1 | 12/2020 | Hattlori et al. | |
| 2021/0028174 | A1 | 1/2021 | Lee | |
| 2021/0134815 | A1 | 5/2021 | Juengling | |
| 2021/0296319 | A1 | 9/2021 | Sukekawa | |
| 2023/0147083 | A1* | 5/2023 | Cho | H10B 43/27 257/314 |
| 2024/0147706 | A1* | 5/2024 | Kim | H10B 12/34 |
| 2024/0170574 | A1* | 5/2024 | Shin | H10B 12/315 |

* cited by examiner

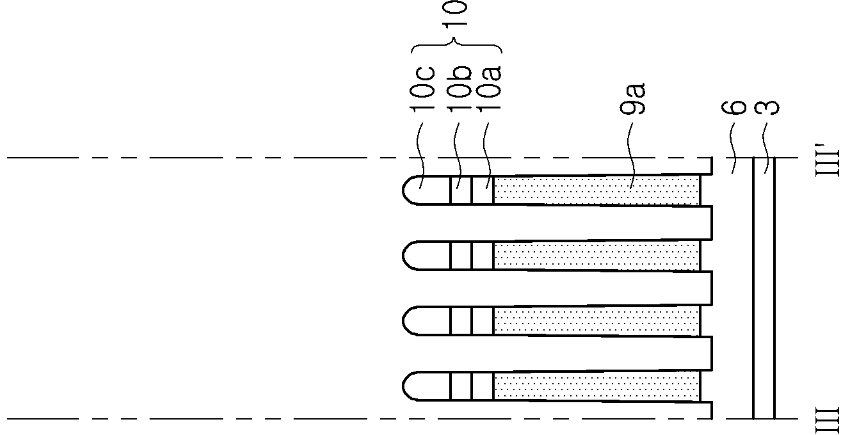
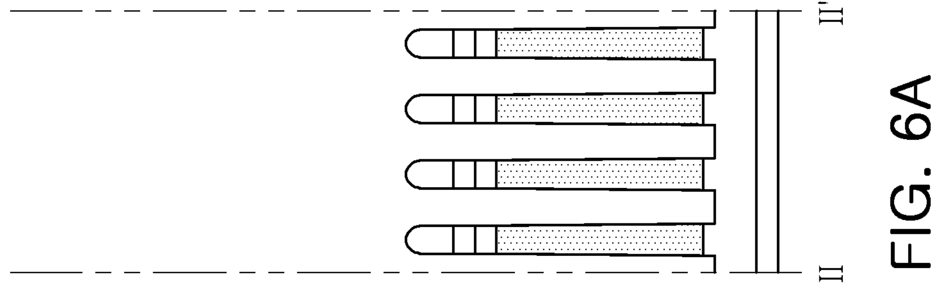
FIG. 6A
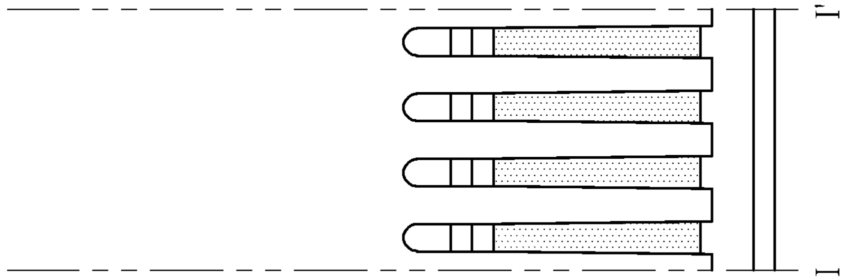

SEMICONDUCTOR DEVICE

CROSS-REFERENCE TO RELATED APPLICATION(S)

This application claims priority under 35 U.S.C § 119 to Korean Patent Application No. 10-2022-0157645, filed on Nov. 22, 2022, in the Korean Intellectual Property Office, the disclosure of which is herein incorporated by reference in its entirety.

TECHNICAL FIELD

Example embodiments of the present disclosure relate to a semiconductor device and a method of manufacturing the same, and more particularly to a semiconductor device including a peripheral semiconductor body.

DISCUSSION OF RELATED ART

Typically, semiconductor device performance may be improved by reducing a size of the elements of the semiconductor device. These elements may include components of transistors, for example. Reductions in the size of the elements may lead to higher element density, improved power efficiency, and lower manufacturing costs. As the size of the elements is reduced, it is becoming increasingly difficult to implement transistors having a desired level of performance, for example, due to challenges related to heat dissipation and design complexity.

SUMMARY

Some embodiments of the present disclosure may provide a semiconductor device having an increased degree of integration and improved performance.

An example embodiment of the present disclosure may provide a method of forming a semiconductor device having an increased degree of integration and improved performance.

According to an example embodiment of the present disclosure, a semiconductor device is provided. The semiconductor device includes: a lower structure including a bit line; a cell semiconductor body vertically overlapping the bit line; a peripheral semiconductor body including a portion disposed on a same level as at least a portion of the cell semiconductor body, on the lower structure; and a peripheral gate on the peripheral semiconductor body, wherein the peripheral semiconductor body includes a lower region having a first width and an upper region having a second width, greater than the first width on the lower region.

According to an example embodiment of the present disclosure, a semiconductor device is provided. The semiconductor device includes: a lower structure; a vertical channel transistor disposed on the lower structure; a peripheral semiconductor body disposed on the lower structure; a peripheral device isolation region disposed on a side surface of the peripheral semiconductor body, on the lower structure; a peripheral gate on an upper surface of the peripheral semiconductor body; and peripheral source/drain regions in the peripheral semiconductor body on both sides of the peripheral gate, wherein the vertical channel transistor includes: a lower cell source/drain region disposed in a lower region of a cell semiconductor body; an upper cell source/drain region disposed in an upper region of the cell semiconductor body; a cell channel region disposed in the cell semiconductor body between the lower cell source/drain region and the upper cell source/drain region; a cell gate electrode facing a first side surface of the cell channel region; and a cell gate dielectric layer between the first side surface of the cell channel region and the cell gate electrode, wherein the lower structure includes a lower insulating layer and a bit line electrically connected to the lower cell source/drain region, wherein the peripheral device isolation region includes a gap-fill insulating layer and a buffer liner between a side surface of the peripheral semiconductor body and a side surface of the gap-fill insulating layer, wherein a lower surface of the gap-fill insulating layer and a lower end portion of the buffer liner are in contact with the lower insulating layer of the lower structure.

According to an example embodiment of the present disclosure, a semiconductor device is provided. The semiconductor device includes: a lower structure; a plurality of vertical channel transistors disposed on the lower structure; a peripheral semiconductor body disposed on the lower structure, at least a portion of the peripheral semiconductor body having a negative slope; and a peripheral device isolation region on the side surface of the peripheral semiconductor body, on the lower structure, wherein each of the vertical channel transistors includes: a lower cell source/drain region disposed in a lower region of a cell semiconductor body; an upper cell source/drain region disposed in an upper region of the cell semiconductor body; a cell channel region disposed in the cell semiconductor body between the lower cell source/drain region and the upper cell source/drain region; a cell gate electrode facing a first side surface of the cell channel region; and a cell gate dielectric layer between the first side surface of the cell channel region and the cell gate electrode, wherein the lower structure includes: a plurality of bit lines electrically connected to the lower cell source/drain regions of the plurality of vertical channel transistors; and a shield structure including a line portion disposed between the bit lines, wherein the peripheral device isolation region includes: a gap-fill insulating layer; and an insulating liner between a side surface of the peripheral semiconductor body and a side surface of the gap-fill insulating layer, wherein an upper end portion of the peripheral semiconductor body is disposed at a first height level, a lower end portion of the peripheral semiconductor body is disposed at a second height level, an upper end portion of the insulating liner is disposed at a third height level, and a lower end portion of the insulating liner is disposed at a fourth height level, wherein a first difference between the first height level and the third height level is different from a second difference between the second height level and the fourth height level.

BRIEF DESCRIPTION OF THE DRAWINGS

The above and other aspects, features, and advantages of the present disclosure will be more clearly understood from the following detailed description, taken in combination with the accompanying drawings, in which:

FIG. 5, FIG. 6A, FIG. 6B, FIG. 6C, FIG. 7, FIG. 8, FIG. 9, FIG. 10, FIG. 11A, FIG. 11B, FIG. 11C, FIG. 12A, FIG. 12B, FIG. 12C, FIG. 13A, FIG. 13B, FIG. 13C, FIG. 14A, FIG. 14B, and FIG. 14C are cross-sectional views illustrating example embodiments of a method of forming a semiconductor device according to an example embodiment of the present disclosure.

DETAILED DESCRIPTION

Hereinafter, embodiments of the present disclosure will be described as follows with reference to the accompanying drawings. Hereinafter, terms such as "upper," "middle," and "lower" may be replaced with other terms such as "first," "second," and "third" and used to describe elements of the disclosure. Terms such as "first," "first lower," "first intermediate," "first upper," "second," "second lower," "second intermediate," "second upper," "third," "third lower," "third intermediate," and "third upper" may be used to describe various elements, but the elements are not limited by the above terms. For example, a "first component" may be referred to as a "second component." Likewise, the "second lower component" may be referred to as a "first component" and the "second upper component" may be referred to as a "first component."

Figure 1:
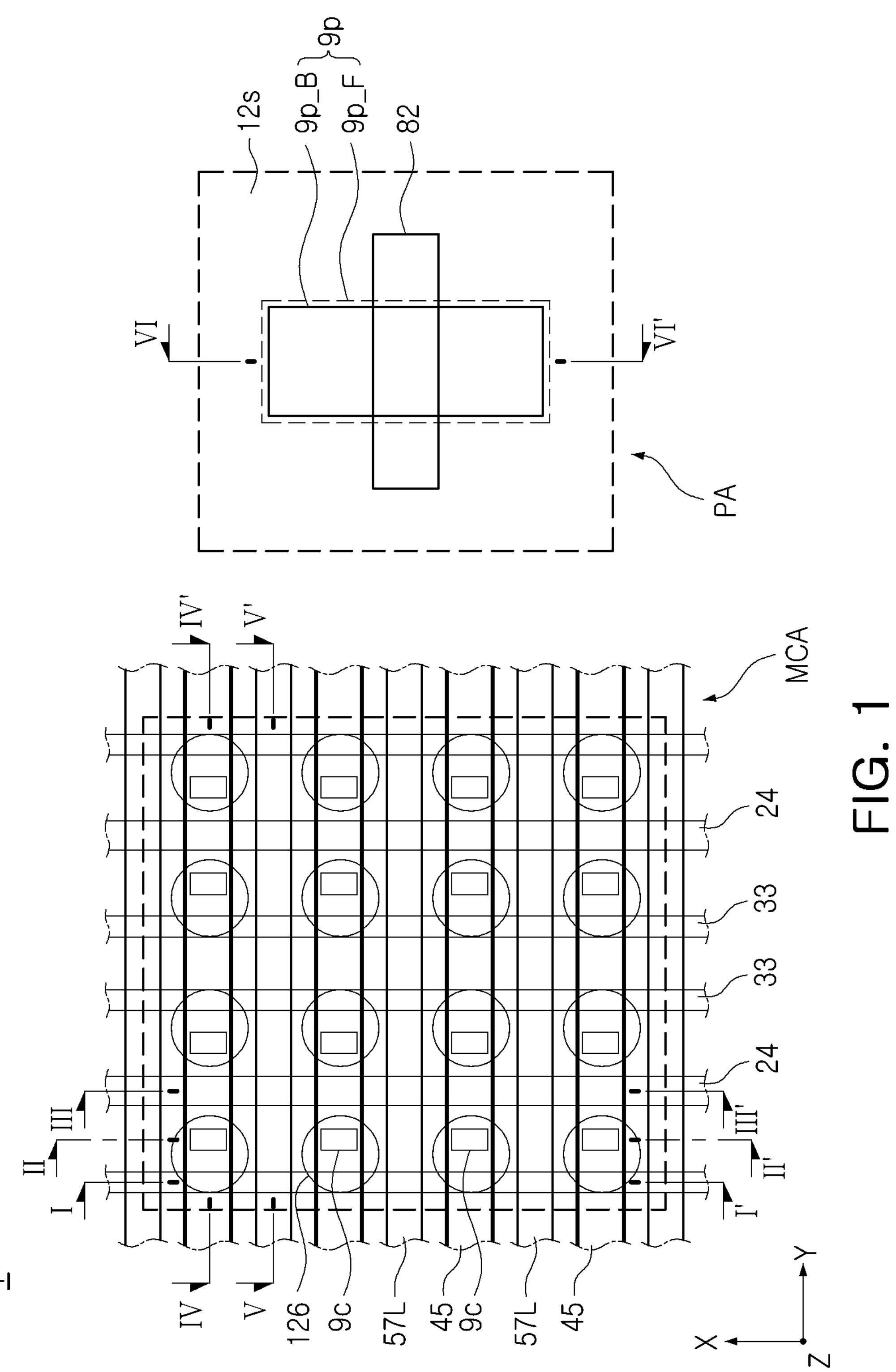
FIG. 1.
Figure 2A:
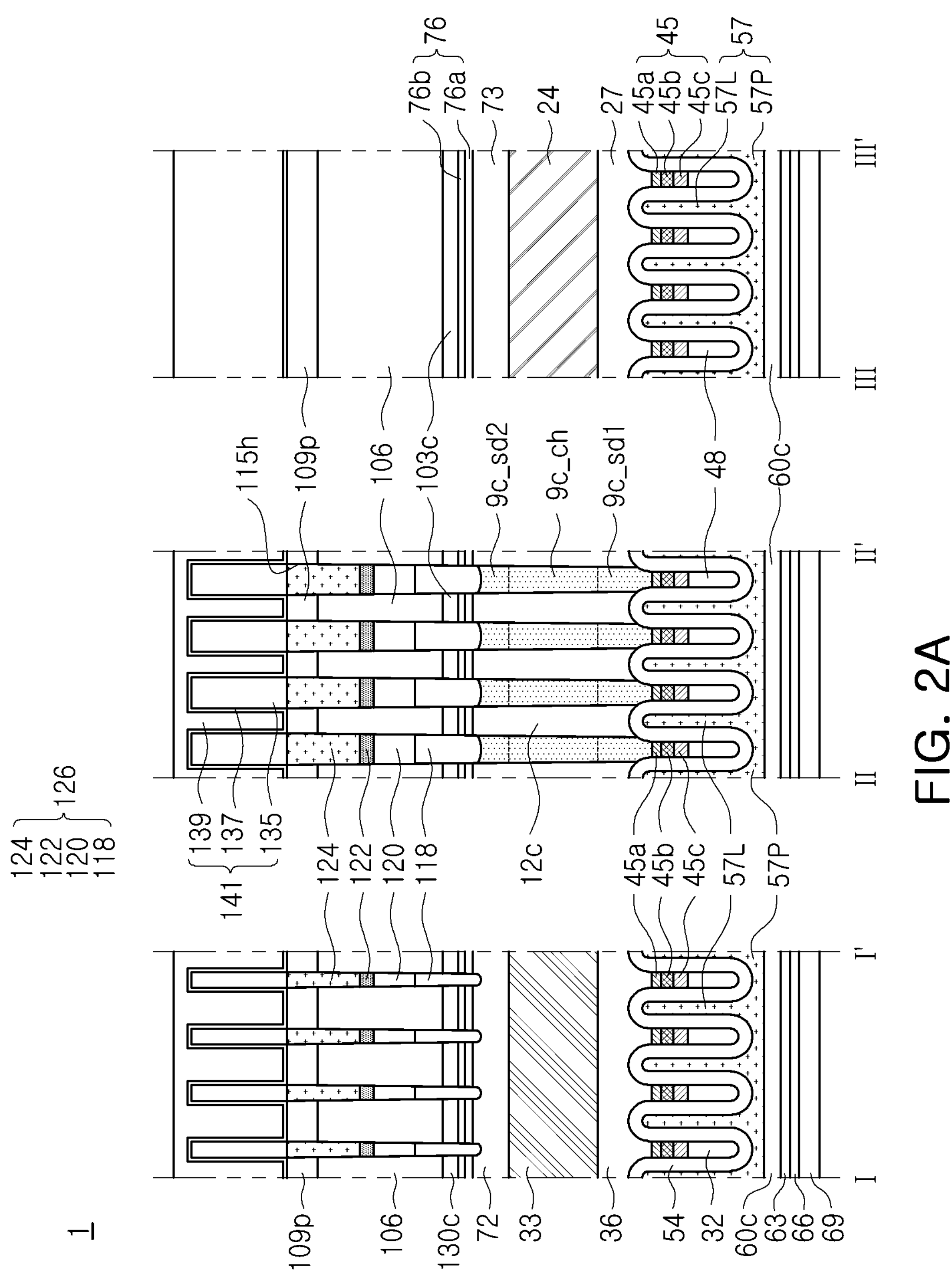
FIG. 2A, FIG. 2B, and FIG. 2C are diagrams illustrating a semiconductor device according to an example embodiment of the present disclosure.
Figure 2B:
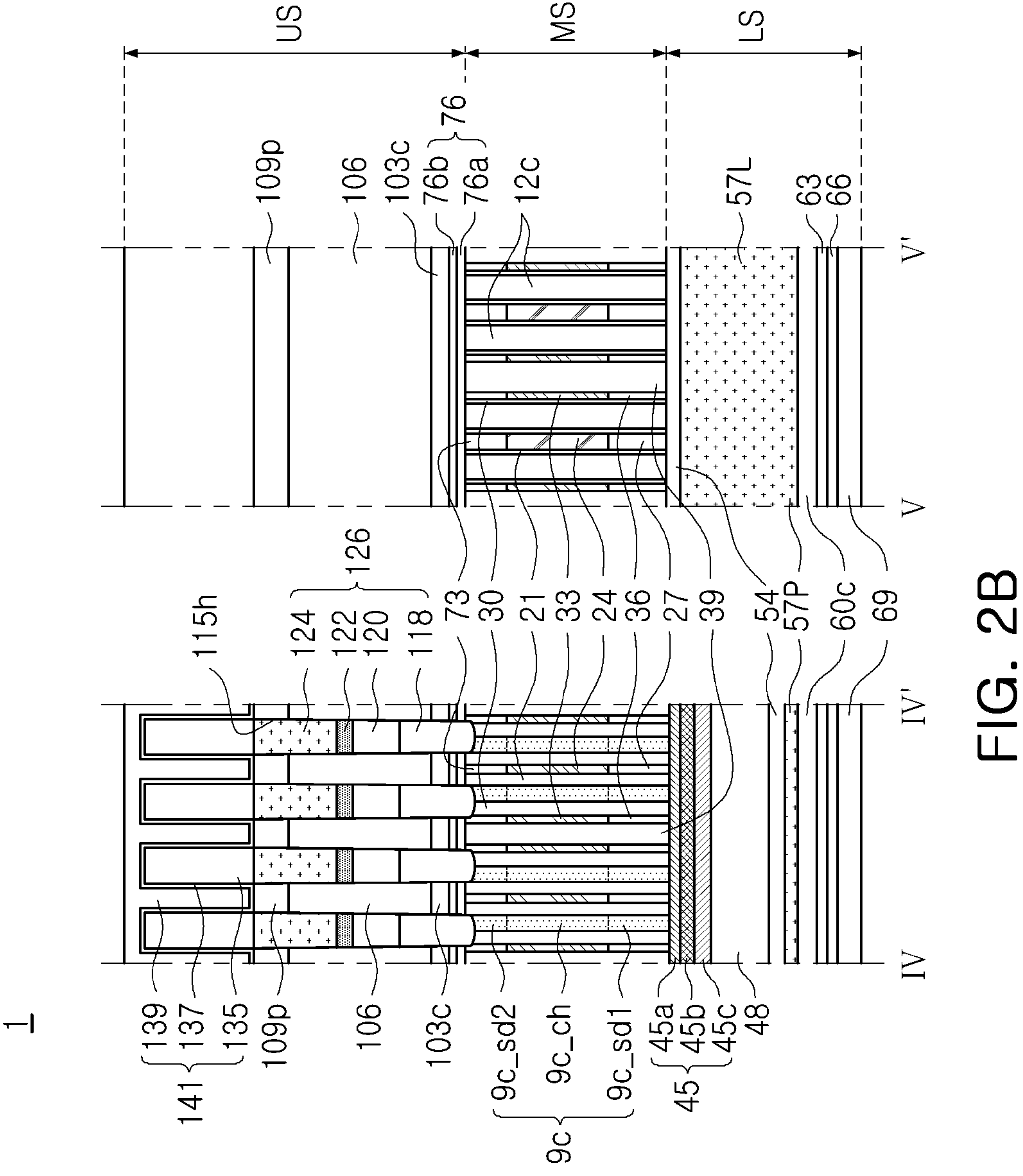
Figure 2C:
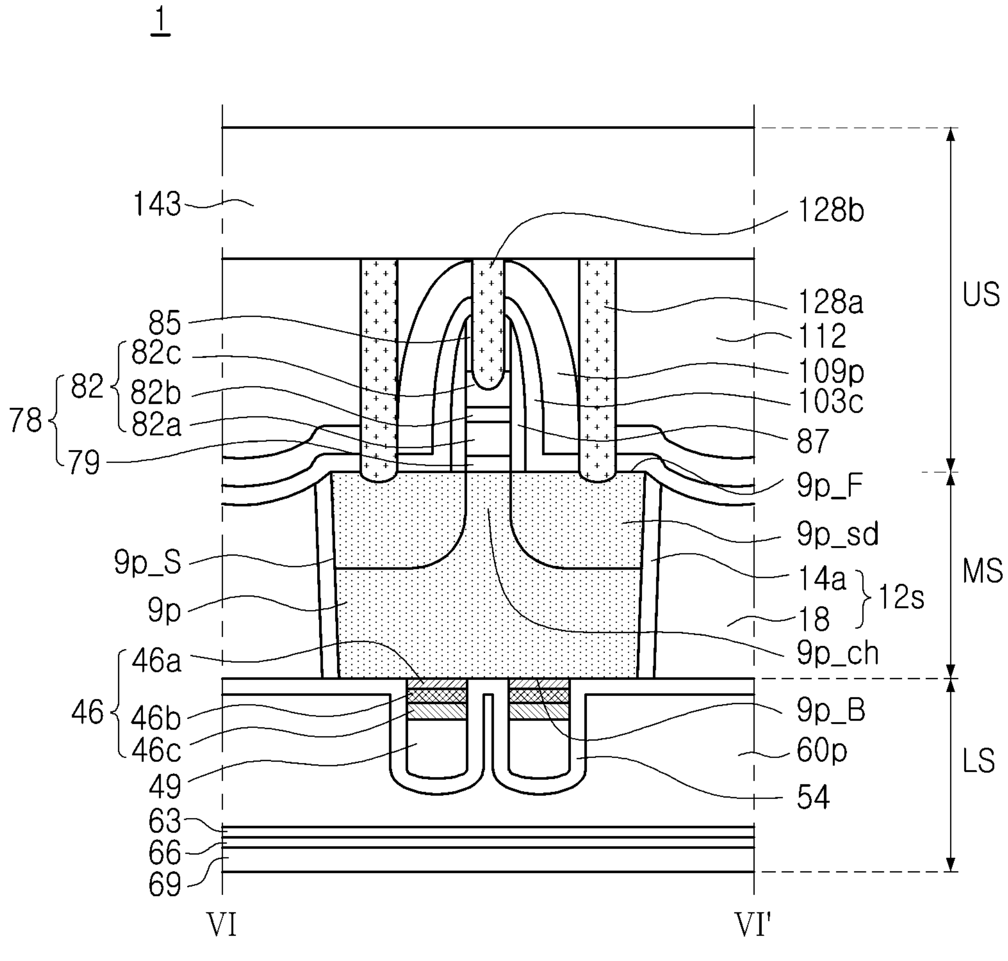

Referring to FIG. 1, FIG. 2A, FIG. 2B, and FIG. 2C, a semiconductor device according to an example embodiment of the present disclosure will be described. FIG. 1 is a top view conceptually illustrating a semiconductor device according to an example embodiment of the present disclosure. FIG. 2A is a cross-sectional view illustrating a region taken along lines I-I', II-II', and III-III' of FIG. 1. FIG. 2B is a cross-sectional view illustrating a region taken along lines IV-IV' and V-V' of FIG. 1. FIG. 2C is a cross-sectional view illustrating a region taken along line VI-VI' of FIG. 1.

Referring to FIG. 1, FIG. 2A, FIG. 2B, and FIG. 2C, a semiconductor device 1 according to an example embodiment may include a cell array region MCA and a peripheral circuit region PA. The semiconductor device 1 may include a lower structure LS, an intermediate structure MS on the lower structure LS, and an upper structure US on the intermediate structure MS.

The lower structure LS may include bit lines 45 disposed in the cell array region MCA.

Each of the bit lines 45 may include at least one conductive material layer. For example, each of the bit lines 45 may include a first conductive layer 45*a*, a second conductive layer 45*b* below the first conductive layer 45*a*, and a third conductive layer 45*c* below the second conductive layer 45*b*.

The first conductive layer 45*a* may include doped polysilicon, for example, polysilicon having N-type conductivity. The second conductive layer 45*b* may include at least one of a metal-semiconductor compound layer or a conductive barrier layer. For example, the metal-semiconductor compound layer may include at least one of a tungsten silicide (Wsi), titanium silicide (TiSi), tantalum silicide (TaSi), nickel silicide (NiSi), or cobalt silicide (CoSi), and the conductive barrier layer may include at least one of titanium nitride (TiN), tantalum nitride (TaN), tungsten nitride (WN), titanium silicide nitride (TiSiN), tantalum silicide nitride (TaSiN), or ruthenium titanium nitride (RuTiN). The third conductive layer 45*c* may include a metal material such as W.

Within the cell array region MCA, the lower structure LS may further include a shield structure 57 including line portions 57L disposed between bit lines 45 (see FIG. 2A). The shield structure 57 may be formed of a conductive material. For example, the shield structure 57 may include doped polysilicon, metal, conductive metal nitride, metal-semiconductor compound, conductive metal oxide, graphene, carbon nanotube, or combinations thereof. The shield structure 57 may also be referred to as a bit line shield structure.

The shield structure 57 may further include a plate portion 57P extending from the line portions 57L disposed between the bit lines 45 and disposed below the bit lines 45 (see FIG. 2A and FIG. 2B).

The shield structure 57 may serve to screen capacitive coupling between the bit lines 45, adjacent to each other. For example, the shield structure 57 may minimize a resistive-capacitive (RC) delay in the bit lines 45, by reducing or blocking parasitic capacitance between the bit lines 45, adjacent to each other.

The lower structure LS may further include bit line capping layers 48 disposed below the bit lines 45 (see FIG. 2A and FIG. 2B). The bit line capping layers 48 may include an insulating material such as silicon nitride, or the like.

The lower structure LS may further include a peripheral conductive pattern 46 disposed within the peripheral circuit region PA and a peripheral capping pattern 49 below the peripheral conductive pattern 46 (see FIG. 2C). The peripheral conductive pattern 46 may be referred to as a body control conductive pattern.

At least a portion of the peripheral conductive pattern 46 may be disposed at a same level as the bit lines 45. The peripheral capping pattern 49 may be formed of the same material as the bit line capping layers 48. At least a portion of the peripheral conductive pattern 46 may include the same material as the bit lines 45. For example, like the bit lines 45, the peripheral conductive pattern 46 may include a first conductive layer 46*a*, a second conductive layer 46*b* below the first conductive layer 46*a*, and a third conductive layer 46*c* below the second conductive layer 46*b*.

The lower structure LS may further include a lower insulating layer 54. Within the cell array region MCA, the lower insulating layer 54 may be disposed between the bit lines 45 and the shield structure 57, and between the bit line capping layers 48 and the shield structure 57. Within the cell array region MCA, the lower insulating layer 54 may cover upper portions of the line portions 57L of the shield structure 57. Within the peripheral circuit region PA, the lower insulating layer 54 may cover a side surface of the peripheral conductive pattern 46, and a side surface and a lower surface of the peripheral capping pattern 49, and be in contact with the intermediate structure MS. The lower insulating layer 54 may include an insulating material such as silicon oxide or silicon nitride. The lower insulating layer 54 may also be referred to as a lower insulating liner, or a lower insulating liner layer.

Within the cell array region MCA, the lower structure LS may further include a shield capping insulating layer 60*c* below the shield structure 57 (see FIG. 2A and FIG. 2B).

Within the peripheral circuit region PA, the lower structure LS may further include a peripheral lower insulating layer 60*p* disposed below the lower insulating layer 54 (see FIG. 2C).

The lower structure LS may further include at least one lower protective layer disposed below the shield structure 57 and the peripheral lower insulating layer 60*p*. The lower protective layers may include a first lower protective layer, a second lower protective layer below the first lower protective layer, and a third lower protective layer, below the second lower protective layer. The lower protective layers may include an insulating material. That is, the first lower protective layer may be insulating layer 63, the second lower protective layer may be insulating layer 66, and the third lower protective layer may be support layer 69.

The intermediate structure MS may include cell semiconductor bodies 9*c*, a peripheral semiconductor body 9*p*, and a peripheral device isolation region 12*s*.

The cell semiconductor bodies 9*c* may be disposed within the cell array region MCA. The cell semiconductor bodies 9*c* may be disposed on the lower structure LS. The cell semiconductor bodies 9*c* on the lower structure LS may vertically overlap the bit lines 45. The cell semiconductor bodies 9*c* may be arranged in a first horizontal direction X and a second horizontal direction Y, wherein the second horizontal direction Y may be perpendicular to the first horizontal direction X.

Hereinafter, one cell semiconductor body among the cell semiconductor bodies 9*c* will be described as an example.

The cell semiconductor body 9*c* may be formed of a semiconductor material. For example, the cell semiconductor body 9*c* may be formed of a single crystal semiconductor material. The cell semiconductor body 9*c* may include a group IV semiconductor, a group III-V compound semiconductor, or a group II-VI compound semiconductor. The cell semiconductor body 9*c* may be a single crystal semiconductor including at least one of silicon, silicon carbide, germanium, or silicon-germanium. For example, the cell semiconductor body 9*c* may include single crystal silicon patterns or single crystal silicon carbide patterns. The cell semiconductor body 9*c* may also be referred to as a semiconductor pattern or a silicon pattern.

The peripheral semiconductor body 9*p* may be disposed within the peripheral circuit region PA and may be disposed on the lower structure LS. The peripheral semiconductor body 9*p* may be formed of the same material as the cell semiconductor body 9*c*. At least a portion of the peripheral semiconductor body 9*p* may be disposed at a same level as the cell semiconductor body 9*c*.

At least a portion of a side surface 9*p*_S of the peripheral semiconductor body 9*p* may have a negative slope. The peripheral semiconductor body 9*p* may include a lower region having a first width and an upper region having a second width, greater than the first width on the lower region, to have the side surface 9*p*_S having a negative slope. The peripheral semiconductor body 9*p* may include a lower surface 9*p*_B and an upper surface 9*p*_F having a greater width than the lower surface 9*p*_B. In the peripheral semiconductor body 9*p*, the lower surface 9*p*_B may be referred to as a first surface, and the upper surface 9*p*_F may be referred to as a second surface.

The peripheral semiconductor body 9*p* may include peripheral source/drain regions 9*p*_sd, spaced apart from each other and a peripheral channel region 9*p*_ch between the peripheral source/drain regions 9*p*_sd. The peripheral source/drain regions 9*p*_sd may be disposed within an upper region of the peripheral semiconductor body 9*p*.

The peripheral device isolation region 12*c* may contact the side surface 9*p*_S of the peripheral semiconductor body 9*p*.

The peripheral device isolation region 12*c* may include a buffer liner 14*a* and a gap-fill insulating layer 18. The buffer liner 14*a* may be disposed between the gap-fill insulating layer 18 and the peripheral semiconductor body 9*p*. The buffer liner 14*a* may include at least one insulating material. For example, the buffer liner 14*a* may include at least one of silicon oxide or silicon nitride. For example, the buffer liner 14*a* may be formed of a silicon oxide layer. The gap-fill insulating layer 18 may include at least one of silicon oxide or a low-K dielectric. The low-dielectric may be an insulating material having a dielectric constant greater than that of silicon oxide.

The cell semiconductor body 9*c* may include a first source/drain region 9*c*_sd1, a second source/drain region 9*c*_sd2 on the first source/drain region 9*c*_sd1, and a channel region 9*c*_ch between the first and second source/drain regions 9*c*_sd1 and 9*c*_sd2. The channel region 9*c*_ch may be a vertical channel region.

The first source/drain region 9*c*_sd1 may be referred to as a lower cell source/drain region, and the second source/drain region 9*c*_sd2 may be referred to as an upper cell source/drain region. The first source/drain region 9*c*_sd1 may be electrically connected to the bit line 45.

The intermediate structure MS may further include cell gate electrodes 33, parallel to each other and back gate electrodes 24, parallel to each other. The pair of cell gate electrodes 33, adjacent to each other may be disposed between the pair of back gate electrodes 24. The cell gate electrodes 33 may be word lines.

Each of the cell gate electrodes 33 and the back gate electrodes 24 may have a linear shape extending in a first horizontal direction X.

In the top view of FIG. 1, the cell gate electrodes 33 and the back gate electrodes 24 illustrated in a linear shape are conceptually represented, and a width of the cell gate electrodes 33 and the back gate electrodes 24 may be changed depending on a position thereof.

A width of each of the cell gate electrodes 33 may be different from that of each of the back gate electrodes 24. For example, the width of each of the cell gate electrodes 33 may be narrower than that of each of the back gate electrodes 24.

Among the cell semiconductor bodies 9*c*, the channel region 9*c*_ch of a cell semiconductor body 9*c* may be disposed between a back gate electrode 24 and a cell gate electrode 33, adjacent to each other, among the back gate electrodes 24 and the cell gate electrodes 33. Accordingly, the cell gate electrode 33, which may be a word line, may be disposed on a first side surface of the cell semiconductor body 9*c*, and the back gate electrode 24 may be disposed on a second side surface of the cell semiconductor body 9*c*. This, the cell gate electrode 33 may face the first side surface of the cell semiconductor body 9*c*, and the back gate electrode 24 may face the second side surface of the cell semiconductor body 9*c*.

The intermediate structure MS may further include an insulating layer 36 below the cell gate electrode 33 and an insulating layer 72 on the cell gate electrode 33. The insulating layer 36 below the cell gate electrode 33 may be referred to as a cell gate lower capping layer, and the insulating layer 72 on the cell gate electrode 33 may be referred to as a cell gate upper capping layer.

The intermediate structure MS may further include an insulating layer 27 below the back gate electrode 24 and an insulating layer 73 on the back gate electrode 24. The insulating layer 27 below the back gate electrode 24 may be referred to as a back gate lower capping layer, and the insulating layer 73 on the back gate electrode 24 may be referred to as a back gate upper capping layer.

The intermediate structure MS may further include a back gate dielectric layer 21 between the cell semiconductor body 9*c* and the back gate electrode 24, and a cell gate dielectric layer 30 between the cell semiconductor body 9*c* and the cell gate electrode 33.

The cell gate dielectric layer 30, the cell gate electrode 33, the first source/drain region 9*c*_sd1, the second source/drain region 9*c*_sd2, and the channel region 9*c*_ch may form a cell transistor. The cell transistor may be referred to as a cell vertical transistor, a vertical transistor, or a vertical channel transistor. Accordingly, the intermediate structure MS may include the cell transistor.

The back gate electrode 24 may suppress or prevent a floating body effect occurring in the channel region 9*c*_ch of the cell transistor, and prevent a threshold voltage of the cell transistor from being varied. Thus, the back gate electrode 24 can stably operate the cell transistor. The intermediate structure MS may further include an insulating layer 39 between the pair of cell gate electrodes 33, adjacent to each other.

A cell device isolation region 12*c* extending in the first horizontal direction X may be further included. The cell device isolation region 12*c* may include an insulating material such as silicon oxide, or the like. The cell semiconductor body 9*c* may have a first side surface, in contact with the cell gate dielectric layer 30, a second side surface, in contact with the back gate dielectric layer 21, and a third side surface, in contact with the cell device isolation region 12*c*.

Within the cell array region MCA, the upper structure US may include a buffer insulating layer 76, a lower insulating liner layer 103*c*, a cell interlayer insulating layer 106, and an upper insulating liner layer 109*p*, sequentially stacked. The buffer insulating layer 76 may include at least one layer, for example, a first buffer insulating layer 76*a* and a second buffer insulating layer 76*b*, sequentially stacked.

Within the cell array region MCA, the upper structure US may further include cell contact structures 126 in holes 115*h*. The holes 115*h* may penetrate through the buffer insulating layer 76, the lower insulating liner layer 103*c*, the cell interlayer insulating layer 106, and the upper insulating liner layer 109*p*. The cell contact structures 126 in holes 115*h* may be electrically connected to the second source/drain regions 9*c*_sd2.

Each of the cell contact structures 126 may include a first layer 118, a second layer 120, a third layer 122, and a fourth layer 124, which may be sequentially stacked.

In an example, the first layer 118 may include epitaxial silicon, e.g., epitaxial silicon having N-type conductivity. When the first layer 118 is formed of epitaxial silicon, the second layer 120 may include polysilicon, for example, polysilicon having N-type conductivity.

In another example, the first layer 118 may include polysilicon, for example, polysilicon having N-type conductivity. When the first layer 118 is formed of polysilicon, the first layer 118 and the second layer 120 may be formed as a single layer.

The third layer 122 may include at least one of a metal-semiconductor compound layer or a conductive barrier layer. For example, the metal-semiconductor compound layer may include at least one of WSi, TiSi, TaSi, NiSi, or CoSi, and the conductive barrier layer may include at least one of TiN, TaN, WN, TiSiN, TaSiN, or RuTiN. The fourth layer 124 may include a conductive material such as W.

Within the cell array region MCA, the upper structure US may further include a data storage structure 141. The data storage structure 141 may include first electrodes 135 electrically connected to the cell contact structures 126, a dielectric layer 137 on the first electrodes 135, and a second electrode 139 on the dielectric layer 137.

In one example, the data storage structure 141 may be a capacitor storing information in a Dynamic Random-Access Memory (DRAM). For example, the dielectric layer 137 of the data storage structure 141 may be a capacitor dielectric layer of a DRAM, and the dielectric layer 137 may include a high-k dielectric layer, silicon oxide, silicon nitride, silicon oxynitride, or a combination thereof.

In another example, the data storage structure 141 may be a structure for storing data and other memory information. For example, the data storage structure 141 may be disposed between the first electrodes 135 and the second electrodes 139, and may be a capacitor of a ferroelectric memory (FeRAM) including a dielectric layer including a ferroelectric layer. For example, the dielectric layer 137 may be a ferroelectric layer capable of recording data using a polarization state. When the data storage structure 141 is a capacitor for storing information of an FeRAM, the ferroelectric layer of the dielectric layer 137 may include an Hf-based compound, a Zirconium (Zr) based compound, and/or a Hafnium-Zirconium (Hf—Zr) based compound.

Within the peripheral circuit region PA, the upper structure US may include a peripheral gate 78. The peripheral gate 78 may include a peripheral gate dielectric layer 79, in contact with an upper surface 9*p*_F of the peripheral semiconductor body 9*p*, and a peripheral gate electrode 82 on the peripheral gate dielectric layer 79. The peripheral gate 78 may be disposed on the channel region 9*p*_ch of the peripheral semiconductor body 9*p*.

The peripheral gate electrode 82 may include a plurality of conductive layers. For example, the conductive layers of the peripheral gate electrode 82 may include a first conductive layer 82*a*, a second conductive layer 82*b*, and a third conductive layer 82*c*, sequentially stacked.

Within the peripheral circuit region PA, the upper structure US may further include a peripheral gate capping pattern 85 on the peripheral gate electrode 82 and a peripheral gate spacer 87 on side surfaces of the peripheral gate electrode 82 and the peripheral gate capping pattern 85.

Within the peripheral circuit region PA, the upper structure US may further include a lower insulating liner layer 103*c* covering the peripheral device isolation region 12*s*, the peripheral semiconductor body 9*p*, the peripheral gate electrode 82, the peripheral gate capping pattern 85, and the peripheral gate spacer 87, an upper insulating liner layer 109*p* on the lower insulating liner layer 103*c*, a peripheral interlayer insulating layer 112 on the upper insulating liner layer 109*p*, and an upper insulating layer 143 on the peripheral interlayer insulating layer 112.

Within the peripheral circuit region PA, the upper structure US may further include a peripheral source/drain contact plug 128*a* and a peripheral gate contact plug 128*b*.

The peripheral source/drain contact plug 128*a* may penetrate through the lower insulating liner layer 103*c*, the upper insulating liner layer 109*p*, and the peripheral interlayer insulating layer 112 within the peripheral circuit region PA, and be electrically connected to the peripheral source/drain region 9*p*_sd. The peripheral gate contact plug 128*b* may penetrate through the lower insulating liner layer 103*c*, the upper insulating liner layer 109*p*, and the peripheral gate capping pattern 85 within the peripheral circuit region PA, and be electrically connected to the peripheral gate electrode 82.

Within the peripheral circuit region PA, the lower insulating liner layer 103*c*, the upper insulating liner layer 109*p*, and the peripheral interlayer insulating layer 112 may form a peripheral insulating structure.

A lower end of the buffer liner 14*a* and a lower surface of the gap-fill insulating layer 18 may contact the lower insulating layer 54 of the lower structure LS.

An upper end of the buffer liner 14*a* and an upper surface of the gap-fill insulating layer 18 may contact the peripheral insulating structure, for example, the lower insulating liner layer 103*c*.

An upper surface of the gap-fill insulating layer 18 may be disposed at a level lower than that of an upper surface 9*p*_F of the peripheral semiconductor body 9*p*. A lower surface of the gap-fill insulating layer 18 may be disposed on substantially the same level as a lower surface 9*p*_B of the peripheral semiconductor body 9*p*.

A difference in heights between a level of the upper surface of the gap-fill insulating layer 18 and the level of the upper surface 9*p*_F of the peripheral semiconductor body 9*p* may be different from a difference in heights between the lower surface of the gap-fill insulating layer 18 and the lower surface 9*p*_B of the peripheral semiconductor body 9*p*.

The difference in heights between the level of the upper surface of the gap-fill insulating layer 18 and the level of the upper surface 9*p*_F of the peripheral semiconductor body 9*p* may be greater than the difference in heights between the lower surface of the gap-fill insulating layer 18 and the lower surface 9*p*_B of the peripheral semiconductor body 9*p*.

Within the peripheral circuit region PA, since a width of an upper region of the peripheral semiconductor body 9*p* may be greater than a width of a lower region thereof, and the peripheral source/drain regions 9*p*_sd may be disposed in the upper region of the peripheral semiconductor body 9*p*, volumes of the peripheral source/drain regions 9*p*_sd may be further increased. Accordingly, performance of a peripheral transistor including the peripheral source/drain regions 9*p*_sd, the peripheral channel region 9*p*_ch, and the peripheral gate 78, including the peripheral gate dielectric layer 79 and the peripheral gate electrode 82, may be improved.

Hereinafter, modified examples will be described. Modified examples may be described with a focus on modified or replaced elements. In addition, elements that can be modified or replaced may be described with reference to certain drawings, but the elements may be combined with each other or with other elements described herein to form a semiconductor device according to example embodiments of the present disclosure.

Figure 3A:
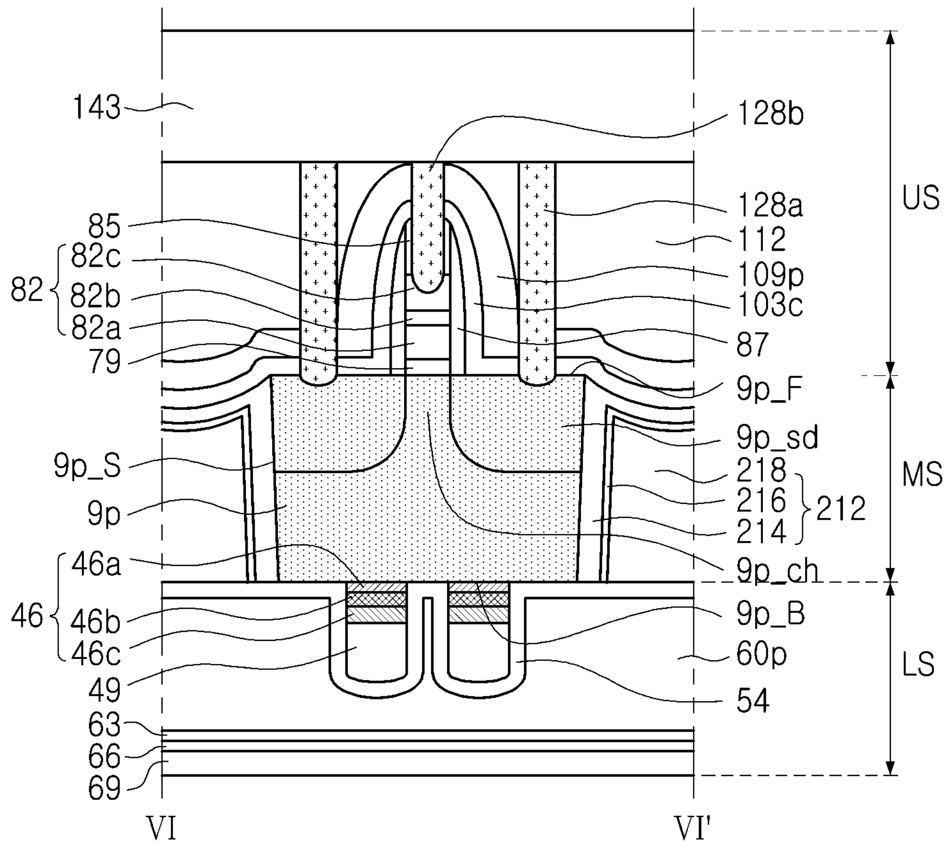
FIG. 3A is a cross-sectional view illustrating a modified example of a semiconductor device according to an example embodiment of the present disclosure.
Figure 3B:
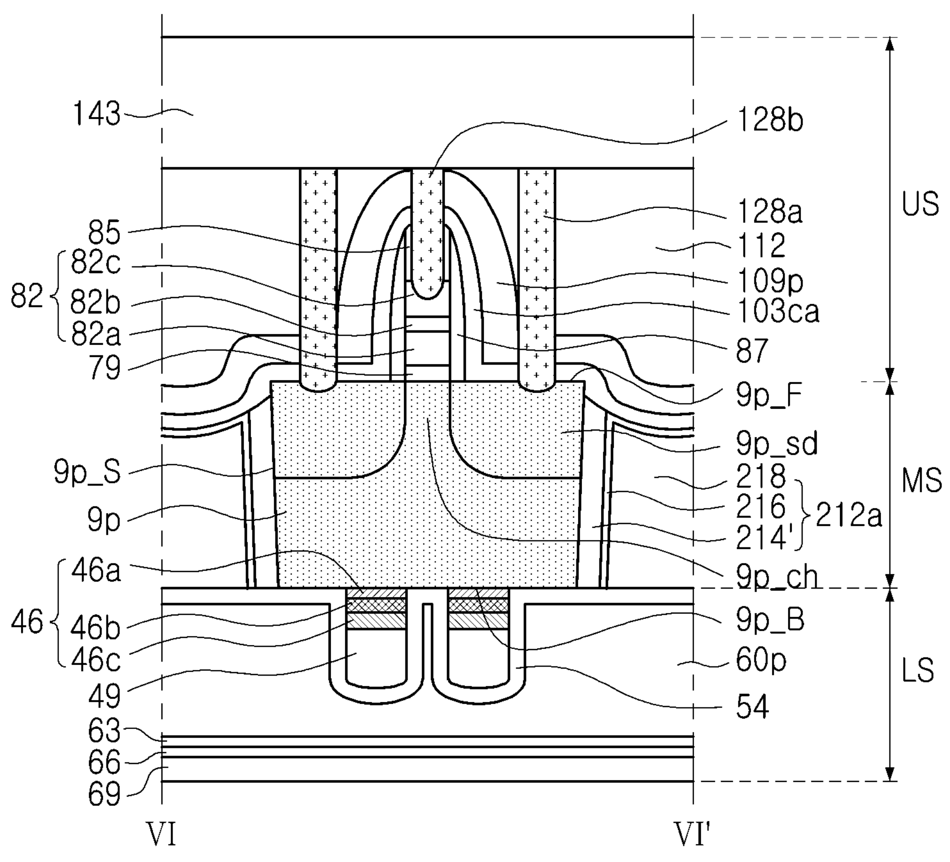
FIG. 3B is a cross-sectional view illustrating a modified example of a semiconductor device according to an example embodiment of the present disclosure.
Figure 3C:
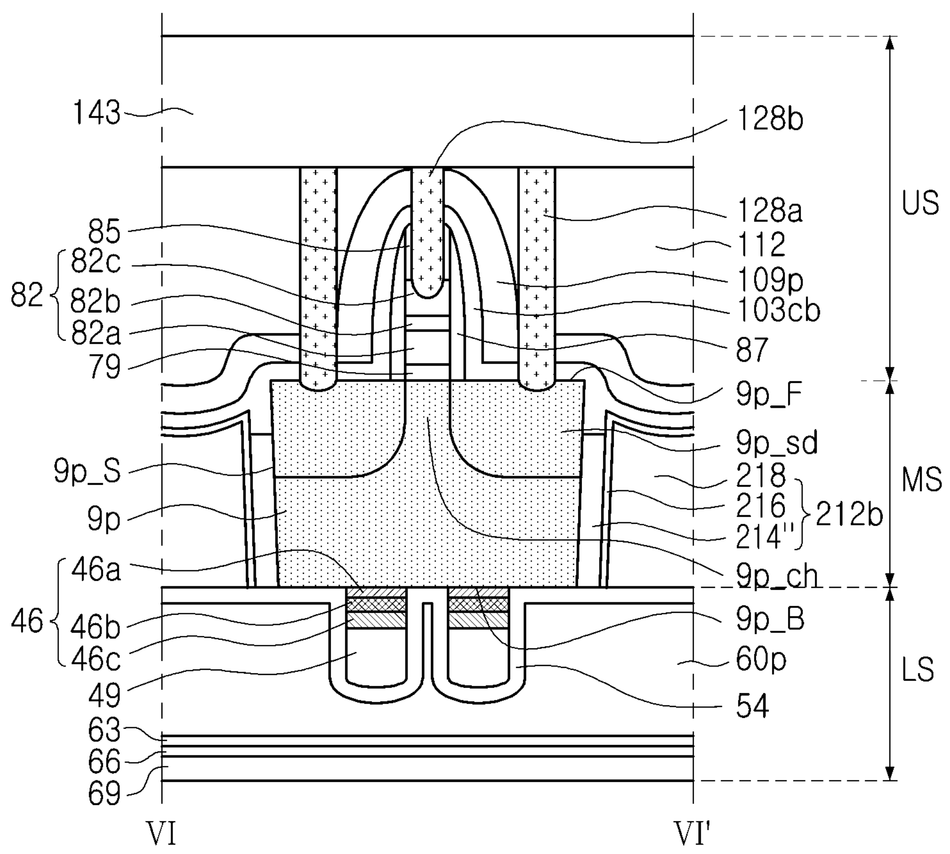
FIG. 3C is a cross-sectional view illustrating a modified example of a semiconductor device according to an example embodiment of the present disclosure.

FIG. 3A, FIG. 3B, and FIG. 3C are cross-sectional views illustrating various modified examples of a semiconductor device according to an example embodiment of the present disclosure. In the cross-sectional structure of FIG. 2C illustrating a region taken along the line VI-VI' of FIG. 1, various modified examples of the peripheral device isolation region (12*s* in FIG. 2C) may be illustrated.

In a modified example, referring to FIG. 3A, the peripheral device isolation region (12*s* of FIG. 2C) in FIG. 2C may be modified to be a peripheral device isolation region 212 as in FIG. 3A.

The peripheral device isolation region 212 may include a buffer liner 214, a second insulating liner 216, and a gap-fill insulating layer 218.

The buffer liner 214 may be disposed between a side surface of the gap-fill insulating layer 218 and a side surface 9*p*_S of the peripheral semiconductor body 9*p*. The buffer liner 214 may contact the side surface 9*p*_S of the peripheral semiconductor body 9*p*. The buffer liner 214 may further include a portion extending between an upper surface of the gap-fill insulating layer 218 and the peripheral insulating structure. The peripheral insulating structure may include the lower insulating liner layer 103*c*, the upper insulating liner layer 109*p*, and the peripheral interlayer insulating layer 112. Thus, the buffer liner 214 may cover a side surface and upper surface of the gap-fill insulating layer 218.

The second insulating liner 216 may be disposed between the buffer liner 214 and the gap-fill insulating layer 218. The second insulating liner 216 may contact a side surface and upper surface of the gap-fill insulating layer 218.

A lower end portion of the buffer liner 214, a lower end portion of the second insulating liner 216, and a lower surface of the gap-fill insulating layer 218 may contact the lower insulating layer 54 of the lower structure LS.

An upper end portion of the peripheral semiconductor body 9*p* may be disposed at a first height level, a lower end portion of the peripheral semiconductor body 9*p* may be disposed at a second height level, an upper end portion of the second insulating liner 216 may be disposed at a third height level, and a lower end portion of the second insulating liner 216 may be disposed at a fourth height level. Here, a first difference between the first height level and the third height level may be different from a second difference between the second height level and the fourth height level. The first difference between the first height level and the third height level may be greater than the second difference between the second height level and the fourth height level. The second difference between the second height level and the fourth height level may be greater than or equal to 0.

The buffer liner 214 may cover an upper surface of the second insulating liner 216 and isolate the second insulating liner 216 from the peripheral insulating structure including the lower insulating liner layer 103*c*, the upper insulating liner layer 109*p*, and the peripheral interlayer insulating layer 112.

In a modified example, referring to FIG. 3B, the peripheral device isolation region (212 of FIG. 3A) in FIG. 3A may be replaced with a peripheral device isolation region 212*a* including a first modified buffer liner 214'. For example, the first modified buffer liner 214' may be disposed between a side surface of the gap-fill insulating layer 218 and a side surface 9*p*_S of the peripheral semiconductor body 9*p*, and may not cover an upper surface of the second insulating liner 216 on an upper surface of the gap-fill insulating layer 218. Accordingly, an upper end portion of the first modified buffer liner 214' and an upper surface of the second insulating liner 216 may contact the peripheral insulating structure including the lower insulating liner layer 103*c*, the upper insulating liner layer 109*p*, and the peripheral interlayer insulating layer 112.

An upper end portion of the first modified buffer liner 214' may be disposed at a higher level than that of an upper end portion of the second insulating liner 216, and may be disposed at a lower level than that of an upper surface of the peripheral semiconductor body 9*p*.

The lower insulating liner layer (103*c* in FIG. 3A) of the peripheral insulating structure described above may be modified to be a modified lower insulating liner layer 103*ca* covering a portion of side surfaces of the upper region of the peripheral semiconductor body 9*p*. In a modified example, referring to FIG. 3C, the peripheral device isolation region 212*a* in FIG. 3B may be replaced with a peripheral device isolation region 212*b* including a second modified buffer liner 214". For example, the second modified buffer liner 214" may be disposed between a side surface of the gap-fill insulating layer 218 and a side surface 9*p*_S of the peripheral semiconductor body 9*p*, and have an upper end portion located at a level lower than that of the second insulating liner 216.

The modified lower insulating liner layer (103*ca* in FIG. 3B) of the peripheral insulating structure described above may cover a portion of side surfaces of the upper region of the peripheral semiconductor body 9*p*, and may be modified to be a modified lower insulating liner layer 103*cb* extending between the peripheral semiconductor body 9*p* and the second insulating liner 216.

Figure 4:
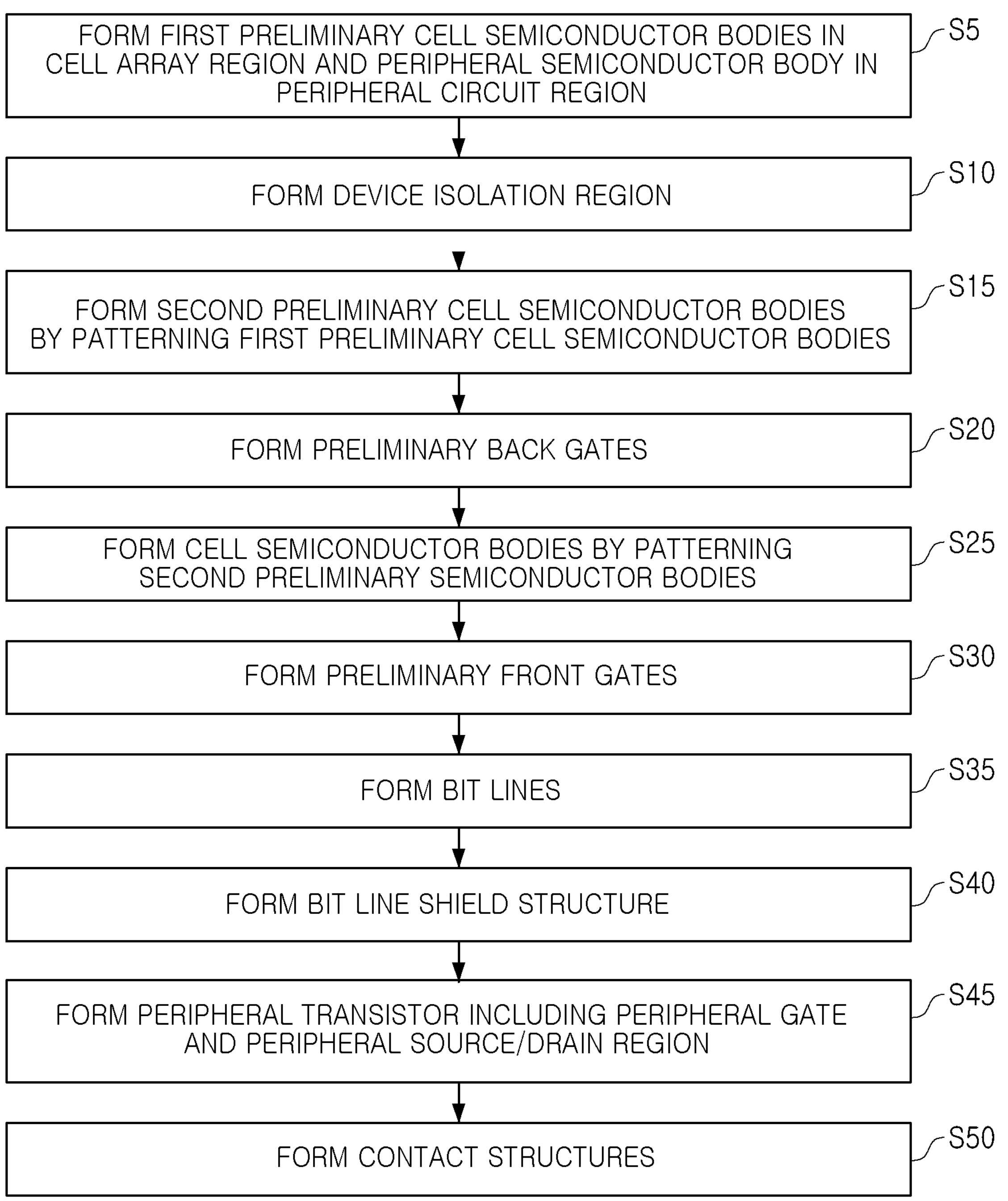
FIG. 4 is a process flow diagram illustrating example embodiments of a method of forming a semiconductor device according to an example embodiment of the present disclosure.
Figure 5:
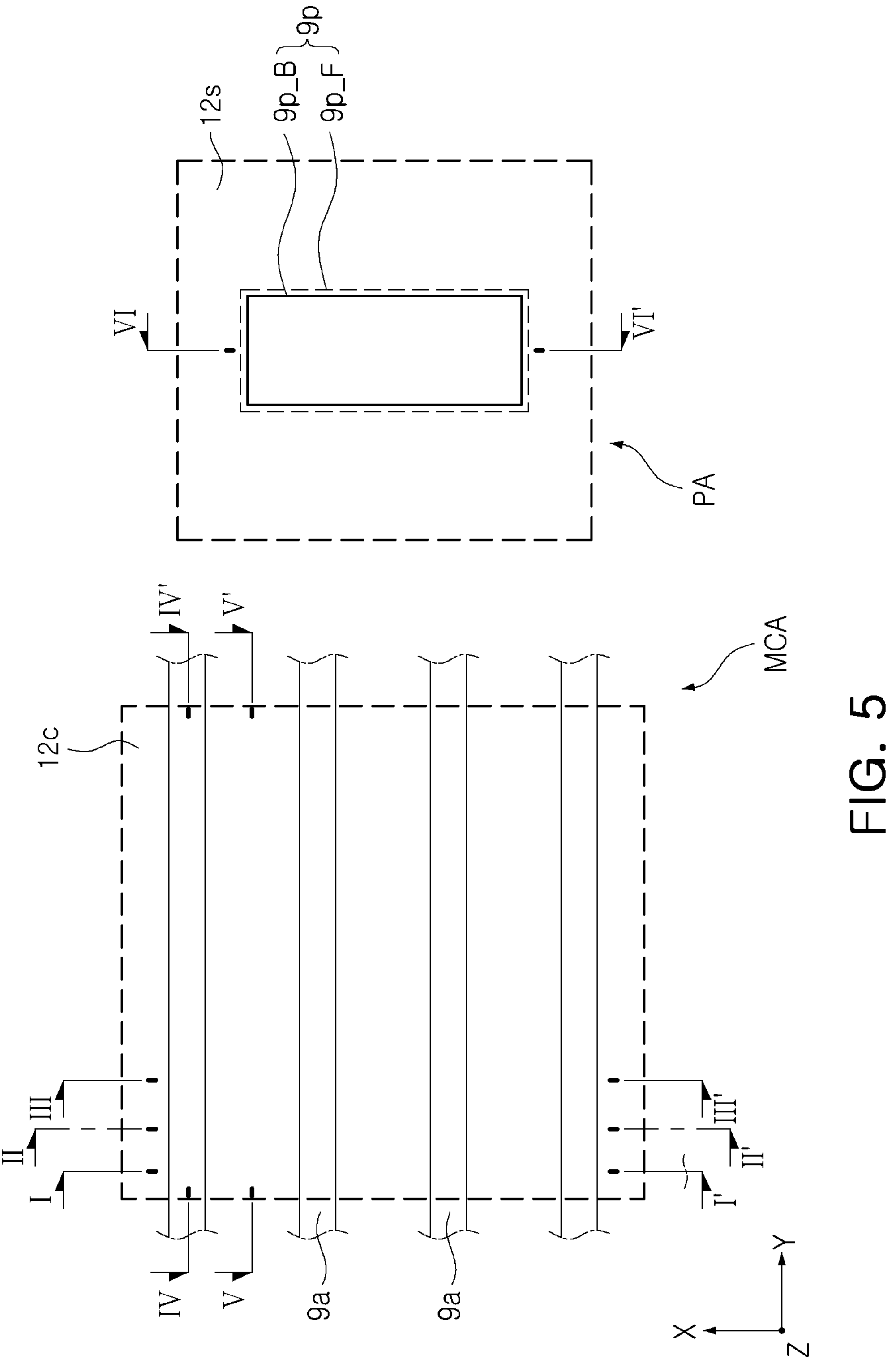
Figure 6B:
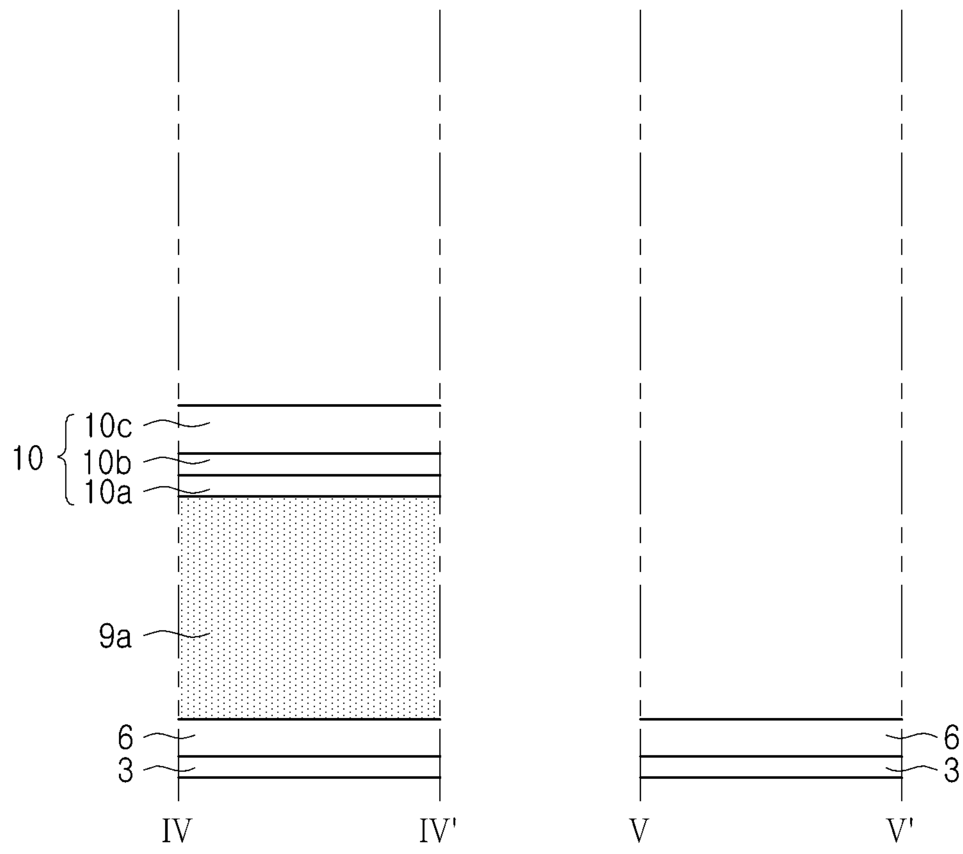
Figure 6C:
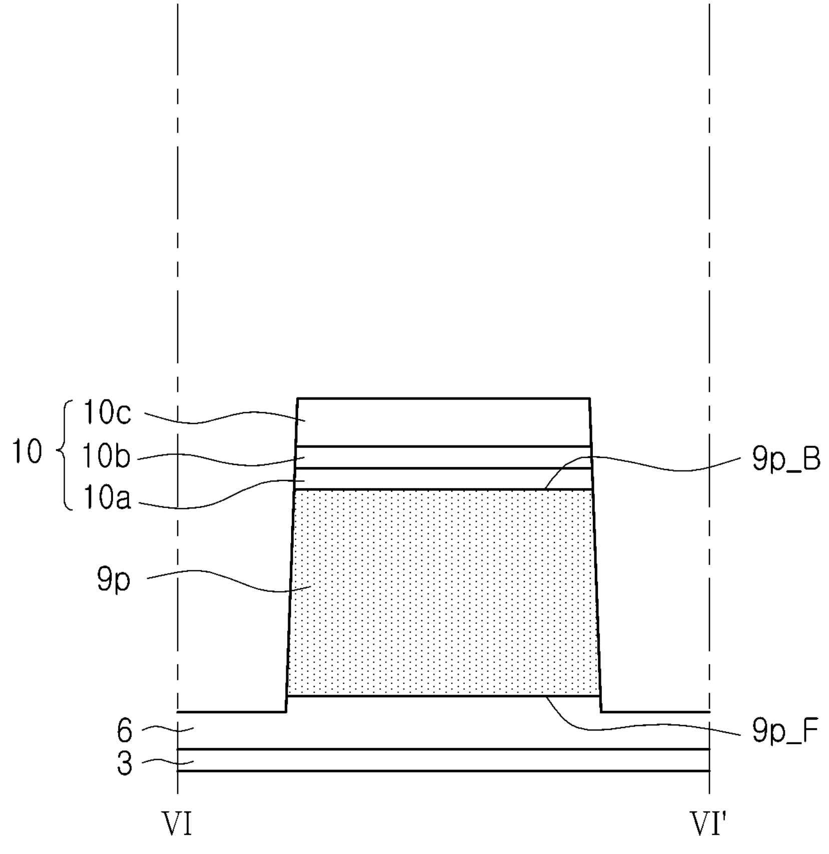
Figure 7:
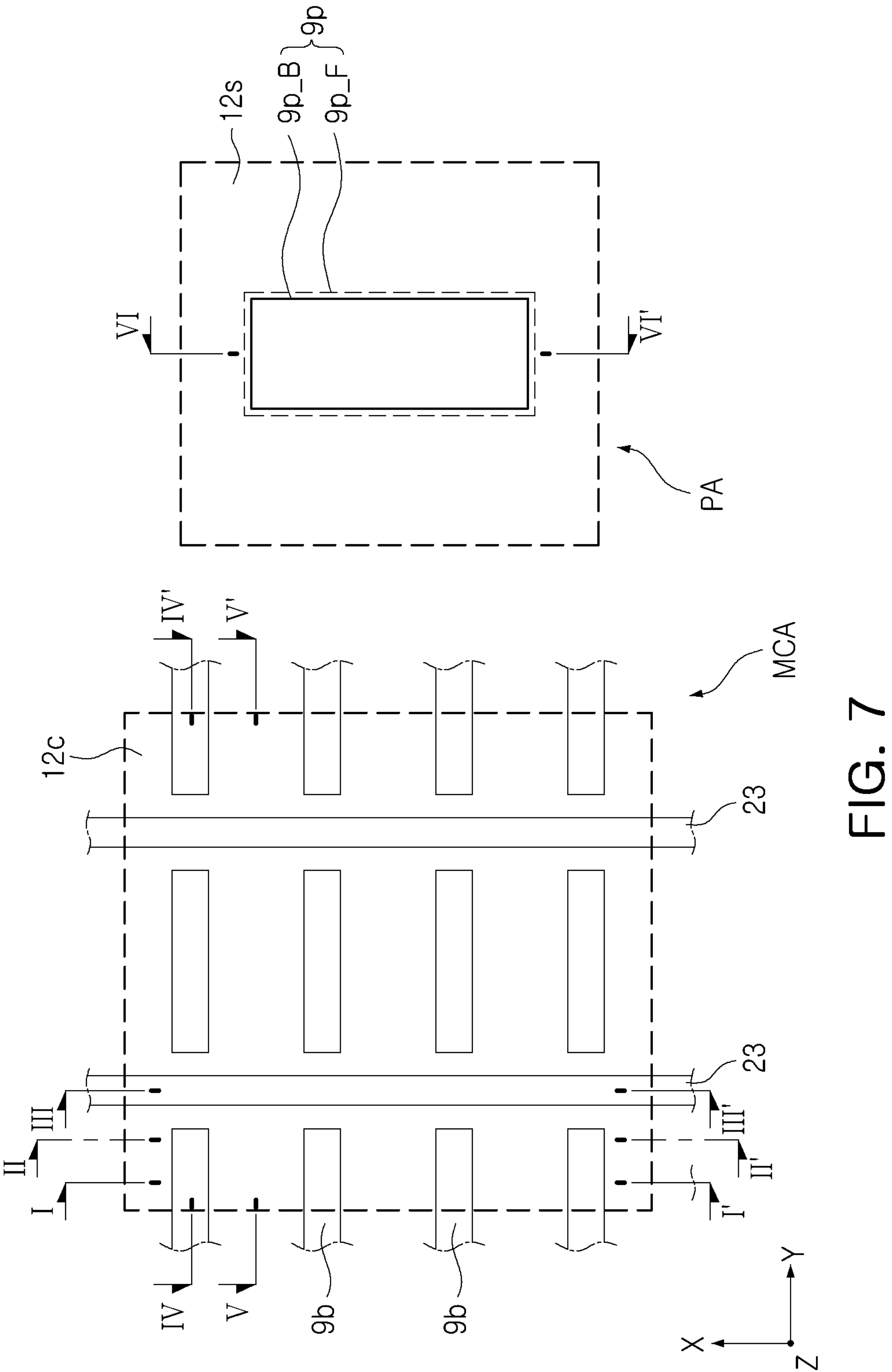
Figure 8:
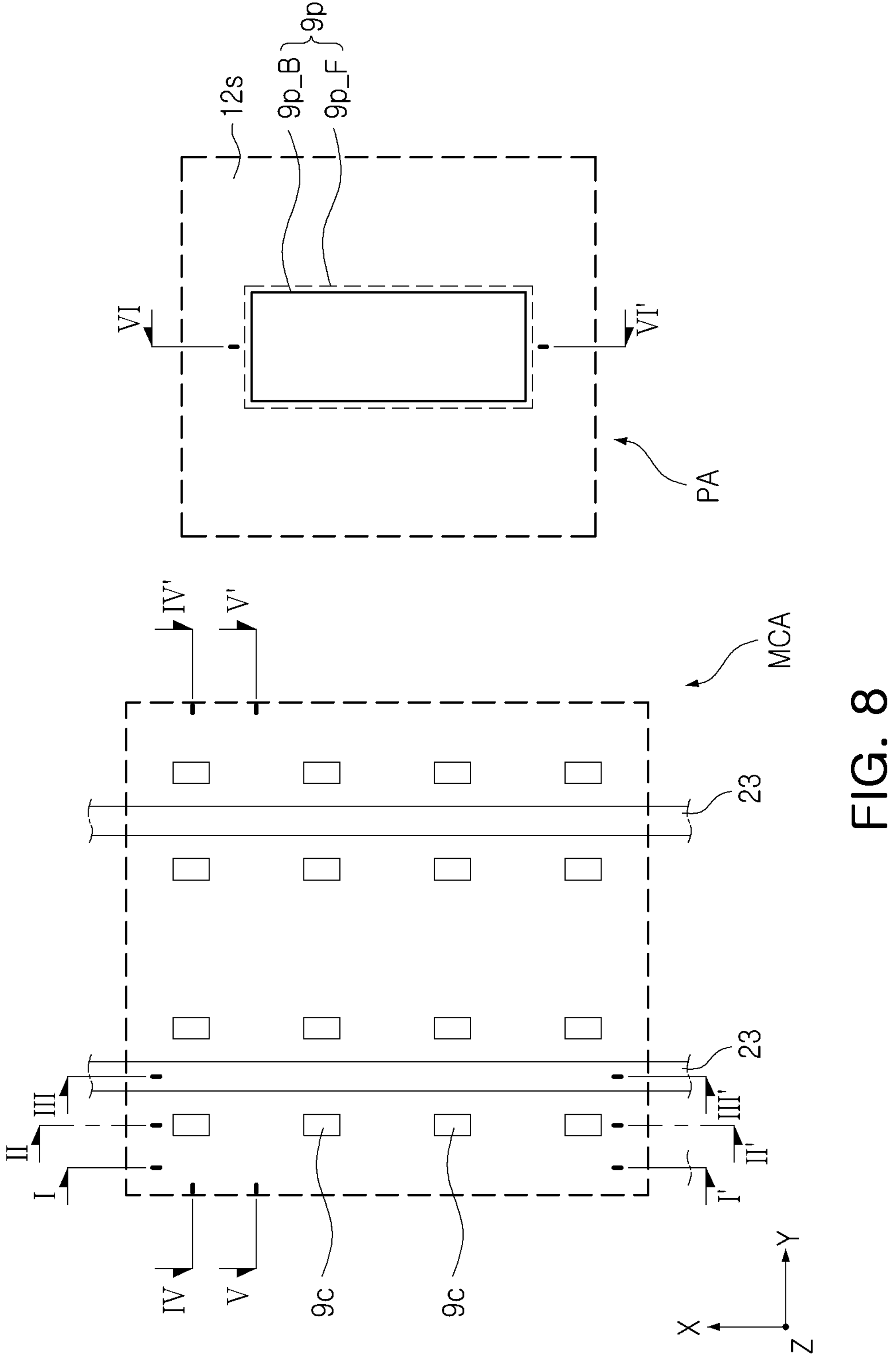

Example embodiments of a method of forming a semiconductor device will be described with reference to FIG. 4 and FIG. 5, FIG. 6A, FIG. 6B, FIG. 6C, FIG. 7, FIG. 8, FIG. 9, FIG. 10, FIG. 11A, FIG. 11B, FIG. 11C, FIG. 12A, FIG. 12B, FIG. 12C, FIG. 13A, FIG. 13B, FIG. 13C, FIG. 14A, FIG. 14B, and FIG. 14C. FIG. 4 is a process flow diagram illustrating a method of forming a semiconductor device according to an example embodiment of the present disclosure. FIGS. 5 to 14C are cross-sectional views illustrating example embodiments of a method of forming a semiconductor device. FIG. 5, FIG. 7, FIG. 8, FIG. 9, and FIG. 10 are top views for illustrating example embodiments of a method of forming a semiconductor device. FIG. 6A, FIG. 11A, FIG. 12A, FIG. 13A, and FIG. 14A are cross-sectional views illustrating a region taken along lines I-I'. II-II', and III-III' of FIG. 1. FIG. 6B, FIG. 11B, FIG. 12B, FIG. 13B, and FIG. 14B are cross-sectional views illustrating a region taken along lines IV-IV' and V-V' of FIG. 1. FIG. 6C, FIG. 11C, FIG. 12C, FIG. 13C, and FIG. 14C are cross-sectional views of a region taken along line VI-VI' of FIG. 1.

Referring to FIG. 4, FIG. 5, FIG. 6A, FIG. 6B, and FIG. 6C, first preliminary cell semiconductor bodies 9*a* within the cell array region MCA and a peripheral semiconductor body 9*p* within the peripheral circuit region PA may be formed (S5). The first preliminary cell semiconductor bodies 9*a* and the peripheral semiconductor body 9*p* may be formed using a silicon on insulator (SOI) substrate. For example, in an SOI substrate including a lower single crystal semiconductor layer, an insulating layer, and an upper single crystal semiconductor layer, the upper single crystal semiconductor layer may be patterned by performing an etching process using the mask 10 on the upper single crystal semiconductor layer as an etching mask, and the first preliminary cell semiconductor bodies 9*a* and the peripheral semiconductor body 9*p* may be formed.

The mask 10 may include a plurality of layers. For example, the mask 10 may include a first mask layer 10*a*, a second mask layer 10*b*, and a third mask layer 10*c*, sequentially stacked.

The first preliminary cell semiconductor bodies 9*a* and the peripheral semiconductor body 9*p* may be formed on an insulating layer 6 of a SOI substrate. The insulating layer 6 may be formed on a lower substrate 3, which may be a lower single crystal semiconductor layer of the SOI substrate. The first preliminary cell semiconductor bodies 9*a* and the peripheral semiconductor body 9*p* may be formed of a single-crystal semiconductor, for example, single-crystal silicon.

Each of the first preliminary cell semiconductor bodies 9*a* may have a linear shape extending in a first direction Y.

Each of the first preliminary cell semiconductor bodies 9*a* and the peripheral semiconductor body 9*p* may have a positively inclined side surface. For example, the peripheral semiconductor body 9*p* may have a first surface 9*p*_F, in contact with the insulating layer 6 and a second surface 9*p*_B, in contact with the mask 10. A width of the first surface 9*p*_F may be greater than that of the second surface 9*p*_B.

Referring to FIG. 4, FIG. 7, FIG. 8, FIG. 9, FIG. 10, FIG. 11A, FIG. 11B, and FIG. 11C, device isolation regions may be formed (S10). The device isolation regions may include a cell device isolation region 12*c* on side surfaces of the first preliminary cell semiconductor bodies 9*a* and a peripheral device isolation region 12*s* on a side surface of the peripheral semiconductor bodies 9*p*.

The mask 10 may be removed while forming the device isolation regions or after forming the device isolation regions.

In an example, the peripheral device isolation region 12*s* may include an insulating liner 14 and a gap-fill insulating layer 18 on the insulating liner 14. The insulating liner 14 may include silicon oxide, and the gap-fill insulating layer 18 may include at least one of silicon oxide or a low-K dielectric. The low-K dielectric may be a dielectric having a dielectric constant lower than that of silicon oxide.

In an example, the cell device isolation region 12*c* may be formed of the same material as that of the insulating liner 14.

The first preliminary cell semiconductor bodies (9*a* in FIG. 5) may be patterned to form second preliminary cell semiconductor bodies (9*b* of FIG. 7) (S15). Each of the second preliminary cell semiconductor bodies (9*b* of FIG. 7) may have a bar shape extending in the first direction Y. A back gate trench may be formed while patterning the first preliminary cell semiconductor bodies (9*a* in FIG. 5).

Preliminary cell gates may be formed (S20). The preliminary cell gates may include a back gate dielectric layer 21 and a preliminary back gate electrode 23. Forming the preliminary back gates may include forming the back gate dielectric layer 21 covering an inner wall of the back gate trench formed while patterning the first preliminary cell semiconductor bodies (9*a* in FIG. 5), and forming the preliminary back gate electrode 23 partially filling the back gate trench on the back gate dielectric layer 21. Forming the preliminary back gates may further include forming an insulating layer 27 filling the remaining portion of the back gate trench on the preliminary back gate electrode 23.

The back gate dielectric layer 21 may be formed using at least one of a thermal oxidation process or a deposition process. When the back gate dielectric layer 21 is formed by sequentially performing a thermal oxidation process and a deposition process, a portion of the back gate dielectric layer 21 formed on surfaces of the second preliminary cell semiconductor bodies (9*b* in FIG. 7) exposed by the back gate trench may be thicker than the remaining portion by a thermal oxidation process.

Figure 11A:
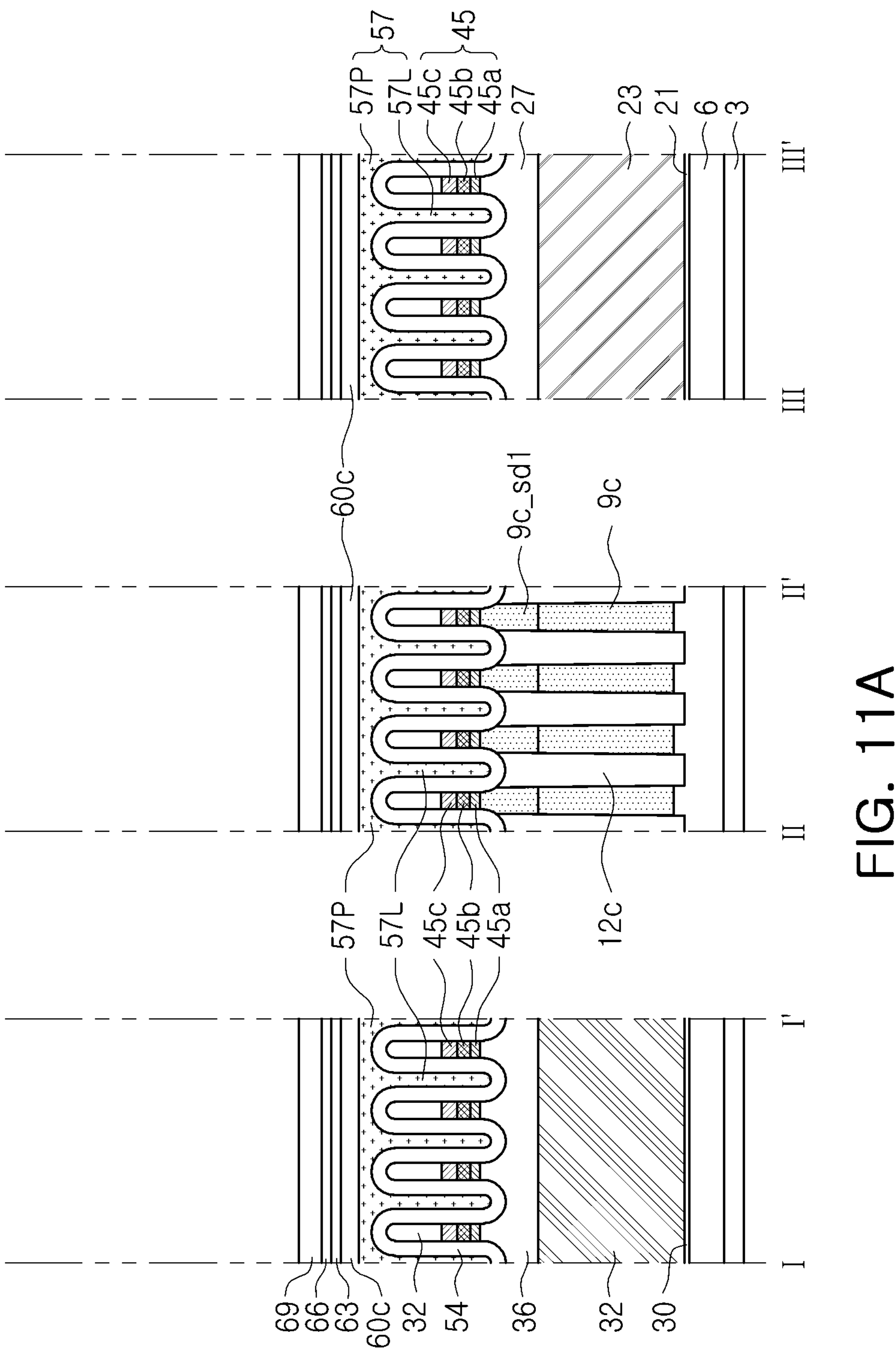
Figure 11B:
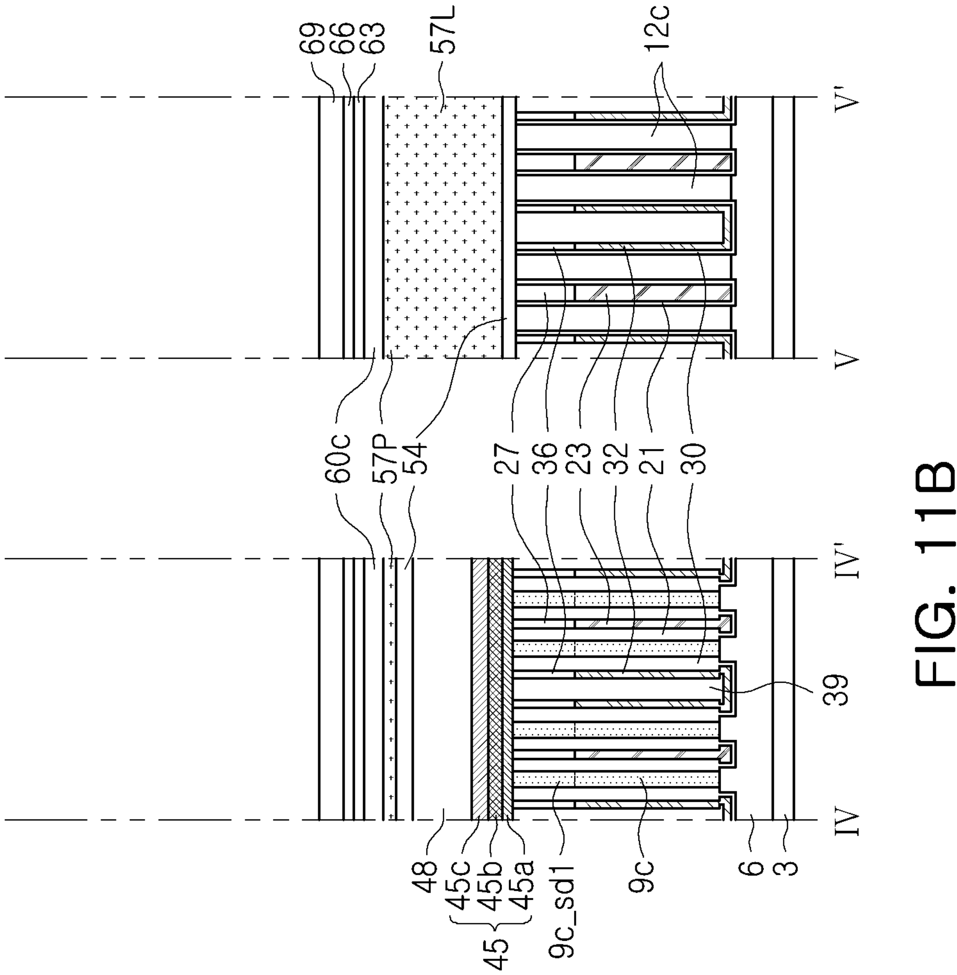

The back gate trench may be filled with the back gate dielectric layer 21, the preliminary back gate electrode 23, and the insulating layer 27 in FIG. 11B, and the back gate trench may be defined as side surfaces of the back gate dielectric layer 21, the preliminary back gate electrode 23, and the insulating layer 27 and a bottom surface of the preliminary back gate electrode 23.

Cell semiconductor bodies (9*c* in FIG. 8) may be formed by patterning the second preliminary semiconductor bodies (9*b* in FIG. 7) (S25). A cell gate trench may be formed while patterning the second preliminary semiconductor bodies (9*b* of FIG. 7).

Preliminary cell gates may be formed (S30). The preliminary cell gates may include a cell gate dielectric layer 30 having a U-shape and a preliminary cell gate electrode 32 having a U-shape. Forming the preliminary cell gates may include forming the cell gate dielectric layer 30 covering an inner surface of the cell gate trench formed while pattering the second preliminary semiconductor bodies (9*b* in FIG. 7), and forming the preliminary cell gate electrode 32 on the cell gate dielectric layer 30. Forming the preliminary cell gates may include forming an insulating layer 39 filling the remaining portion of the cell gate trench on the preliminary cell gate electrode 32, and partially etching the preliminary cell gate electrode 32 and forming an insulating layer 36 formed by partially etching the preliminary cell gate electrode 32.

Figure 9:
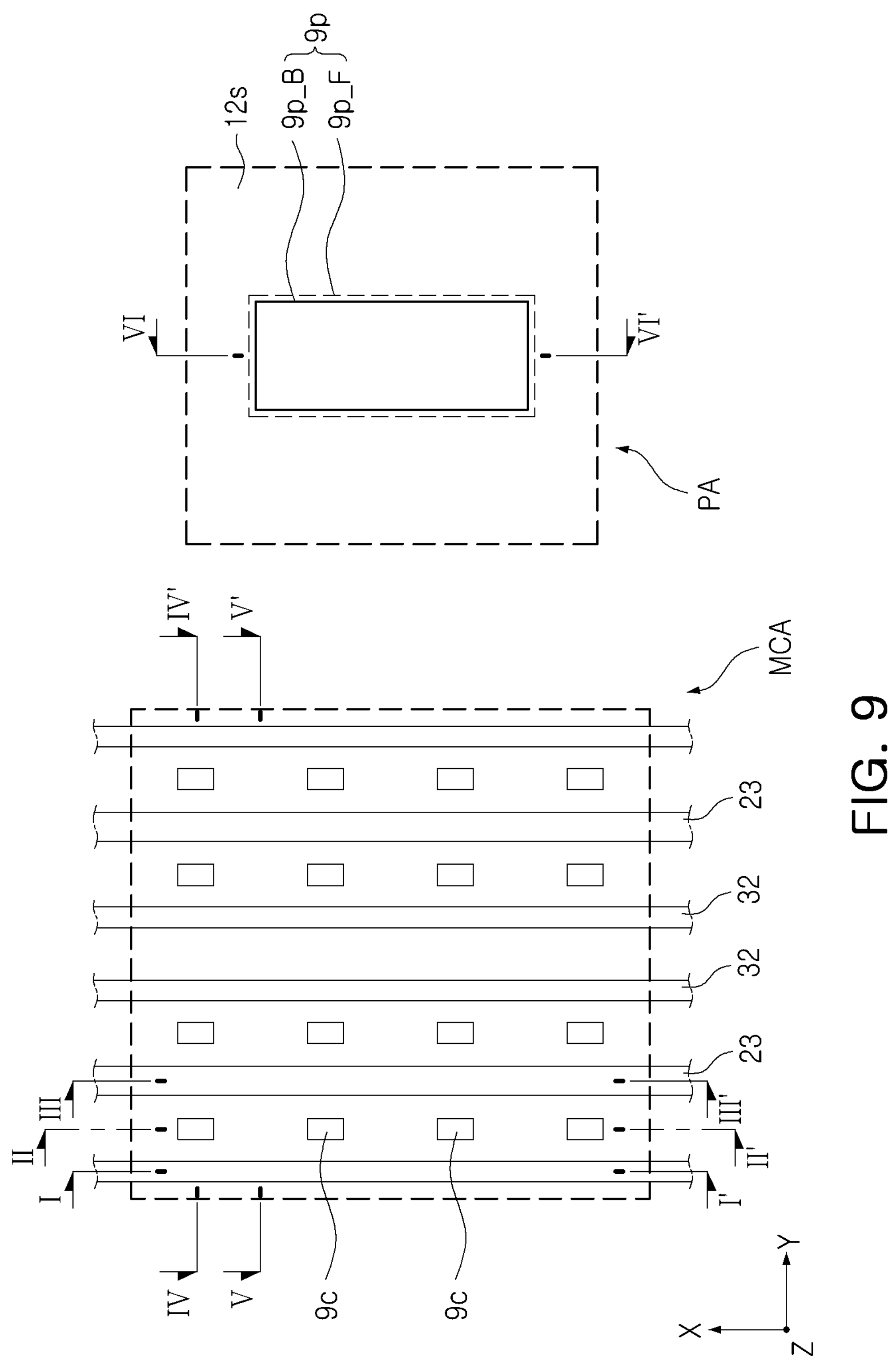
Figure 10:
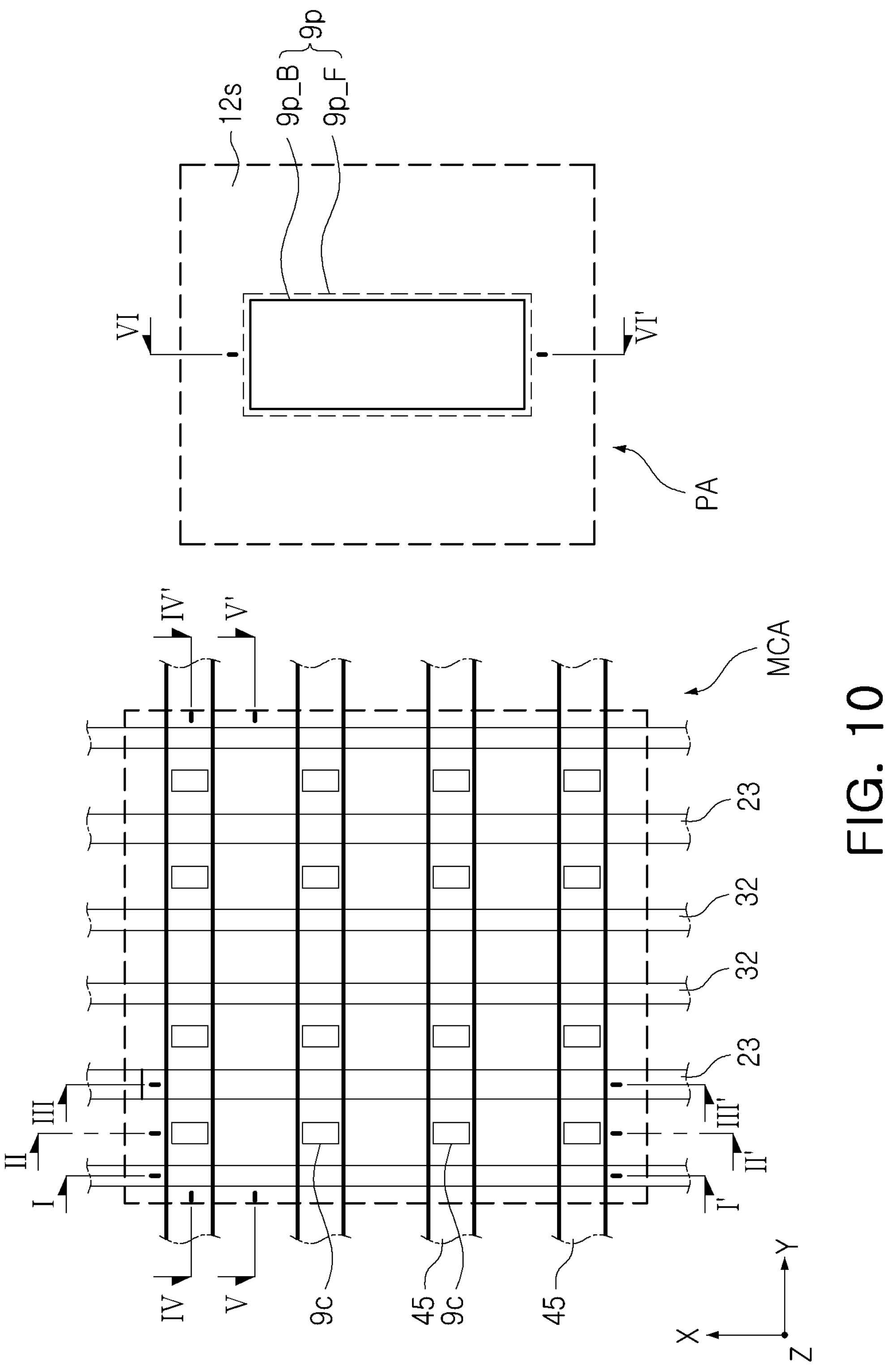

In the preliminary cell gate electrode 32, a line-shaped portion indicated by reference numeral 32 in FIG. 9 may be vertical portions extending in a vertical direction, perpendicular to an upper surface of the lower substrate 3, in FIG. 11A and FIG. 11B.

The cell gate dielectric layer 30 may be formed using at least one of a thermal oxidation process or a deposition process. When the cell gate dielectric layer 30 is formed by sequentially performing a thermal oxidation process and a deposition process, a portion of the cell gate dielectric layer 30 formed on surfaces of the cell semiconductor bodies 9*c* exposed by the cell gate trench may be thicker than the remaining portion by a thermal oxidation process.

The cell gate trench may be defined by outer and bottom surfaces of the cell gate dielectric layer 30 in FIG. 11B.

First cell source/drain regions 9*c*_sd1 may be formed in the cell semiconductor bodies 9*c*.

Bit lines 45 may be formed within the cell array region MCA (S35). The bit lines 45 may be formed by forming a first conductive layer 45*a*, a second conductive layer 45*b*, and a third conductive layer 45*c*, sequentially stacked, forming bit line capping layers 48 on the third conductive layer 45*c*, and patterning the first conductive layer 45*a*, the second conductive layer 45*b*, and the third conductive layer 45*c* by an etching process using the bit line capping layers 48 as an etching mask. Accordingly, each of the bit lines 45 may include the first conductive layer 45*a*, the second conductive layer 45*b*, and the third conductive layer 45*c*, sequentially stacked.

In an example, a peripheral conductive pattern 46 in contact with the second surface 9*p*_B of the peripheral semiconductor body 9*p* within the peripheral circuit region PA and a capping pattern 49 on the peripheral conductive pattern 46 may be formed.

The peripheral conductive pattern 46 and the capping pattern 49 may be formed simultaneously with the bit lines 45 and the bit line capping layers 48. Accordingly, the peripheral conductive pattern 46 includes a first conductive layer 46*a*, a second conductive layer 46*b*, and a third conductive layer 46*c*, sequentially stacked, in the same manner as the bit lines 45.

A lower insulating layer 54 conformally covering the bit lines 45 and the bit line capping layer 48 within the bit lines 45, and conformally covering the peripheral device isolation region 12*s*, the peripheral semiconductor body 9*p*, the peripheral conductive pattern 46, and the peripheral capping pattern 49 within the peripheral circuit region PA may be formed.

A shield structure 57 may be formed on the lower insulating layer 54 (S40). Forming the shield structure 57 may include forming a conductive layer on the lower insulating layer 54 within the cell array region MCA and the peripheral circuit region PA, and removing the conductive layer located within the cell array region MCA. Accordingly, the shield structure 57 may be formed within the cell array region MCA.

The shield structure 57 may include line portions 57L and a plate portion 57P. The line portions 57L may be positioned between structures including the bit lines 45 and the bit line capping patterns 48. The line portions 57L may be disposed between adjacent bit lines. The line portions 57L may extend from the plate portion 57P and include a portion positioned at a level higher than that of the bit line capping patterns 48. The plate portion 57P may have a plate shape connecting the line portions 57L to each other.

An peripheral lower insulating layer 60*p* may be formed on the lower insulating layer 54 within the peripheral circuit region PA.

An insulating layer 63 may be formed on the shield structure 57 and the peripheral lower insulating layer 60*p*.

A support substrate 69 and an insulating layer 66 on the support substrate 69 may be formed. The support substrate 69 may be a silicon substrate.

A wafer bonding process may be performed to bond the insulating layer 63 and the insulating layer 66.

Figure 11C:
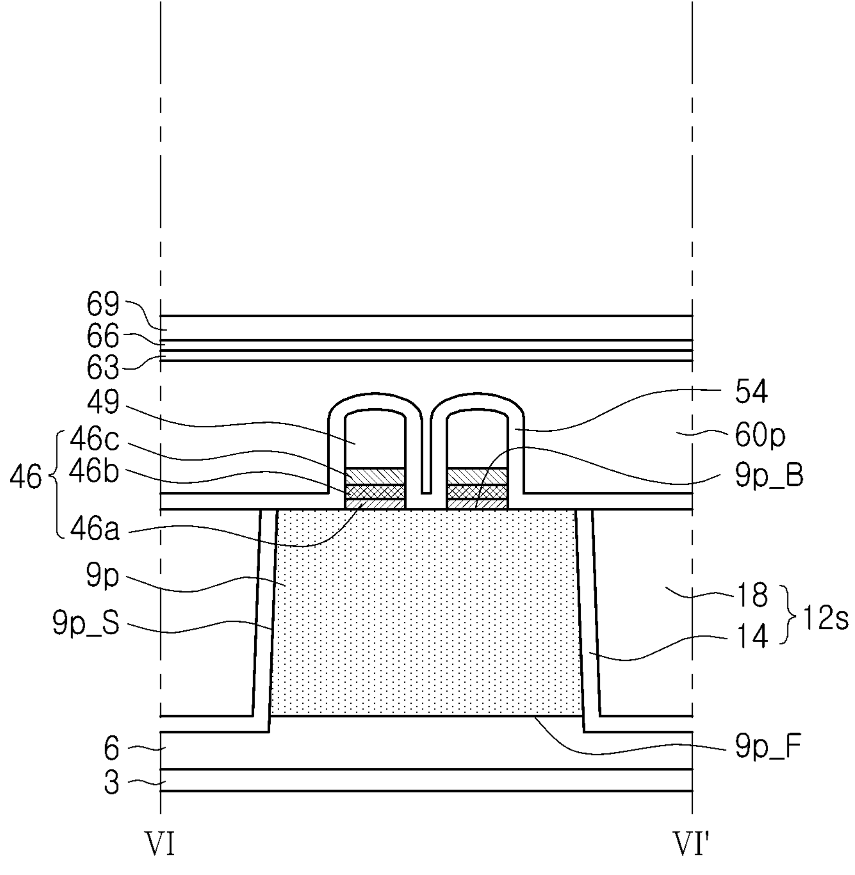
Figure 12A:
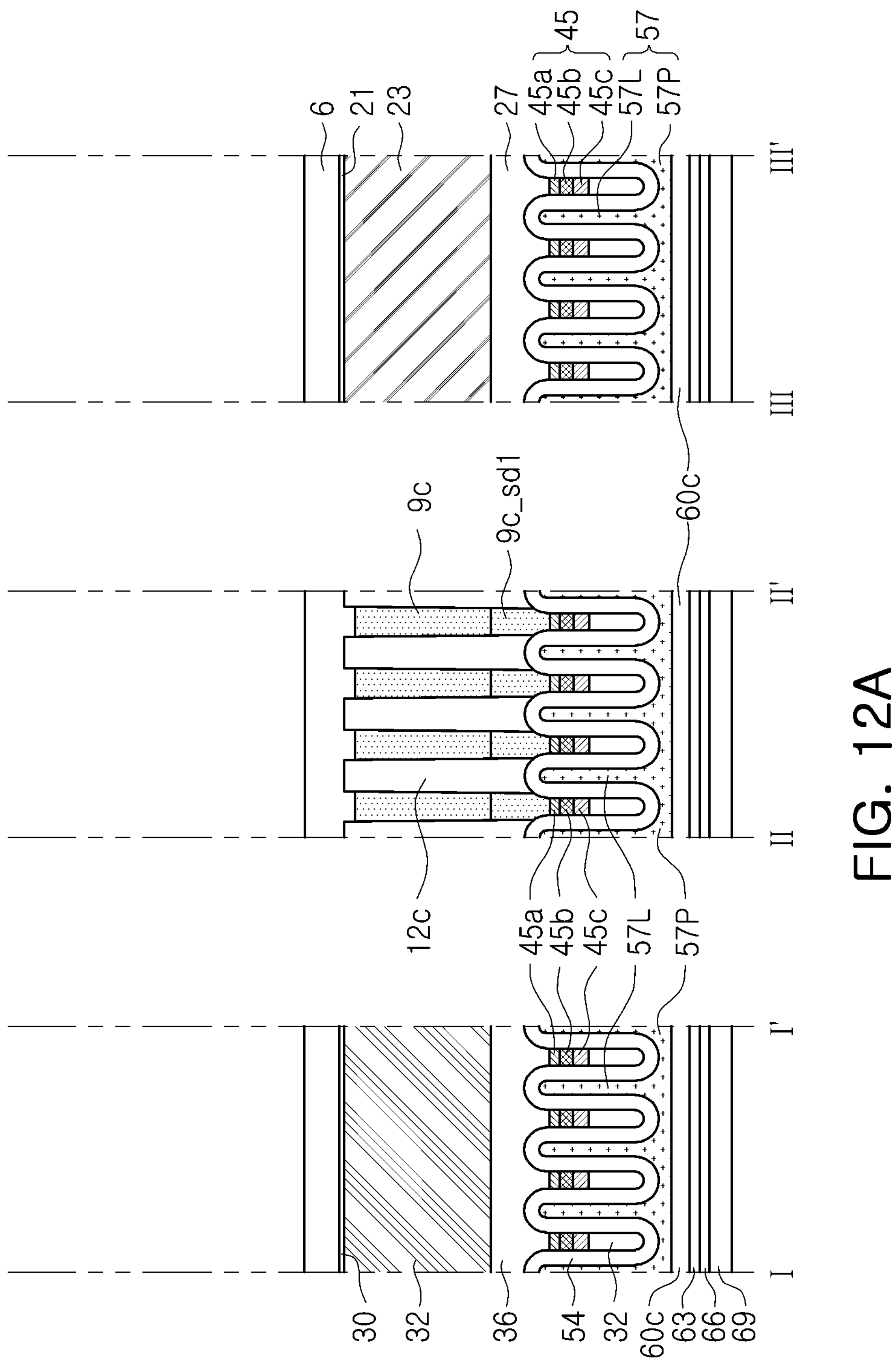
Figure 12B:
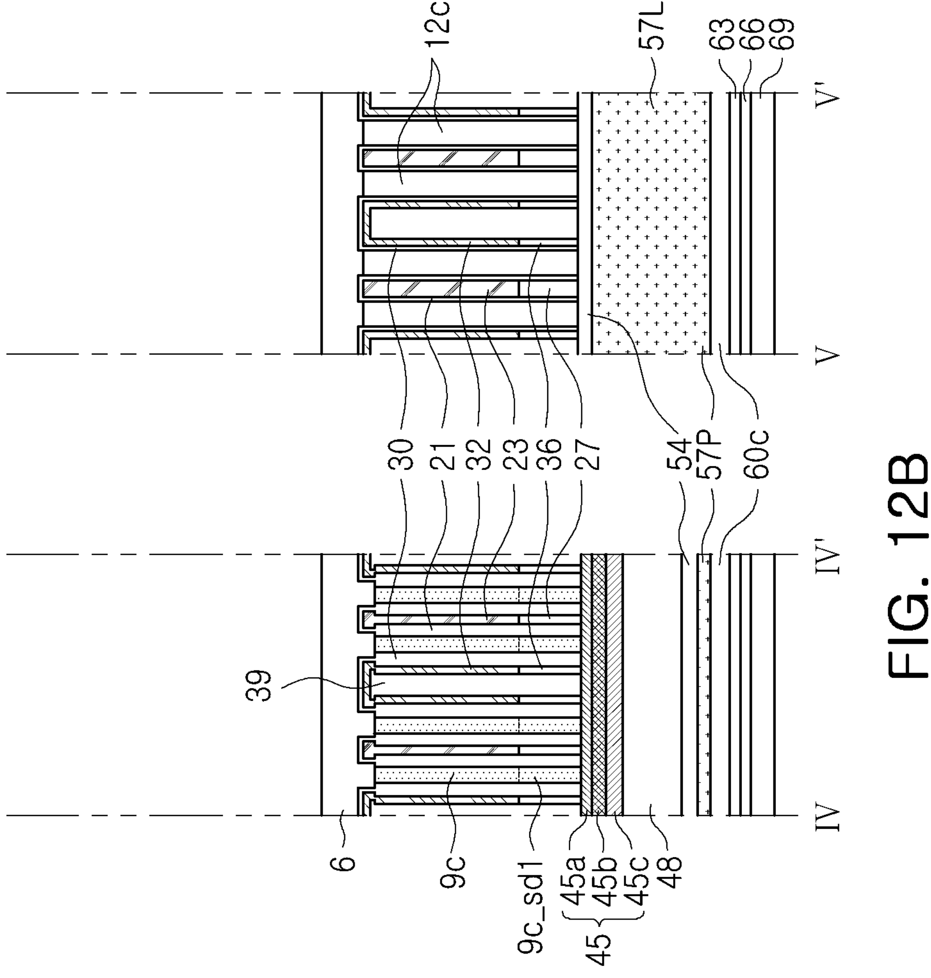
Figure 12C:
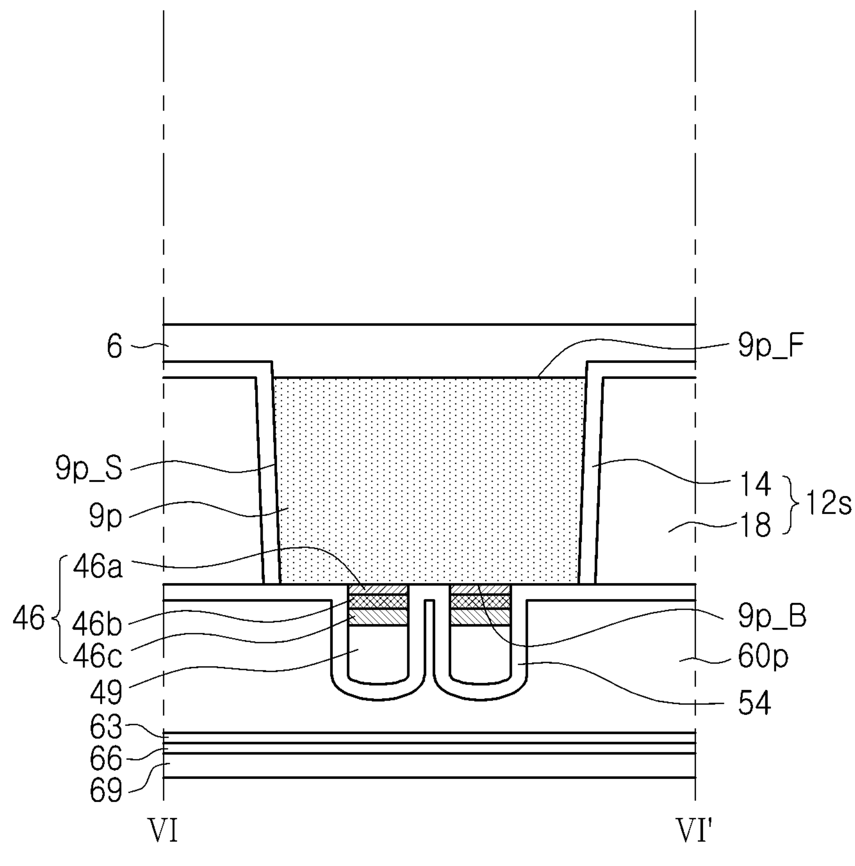

Referring to FIG. 12A, FIG. 12B, and FIG. 12C, the support substrate 69 in FIG. 11A, FIG. 11B, and FIG. 11C may be positioned therebelow, and the lower substrate 3 may be positioned thereabove. Subsequently, the lower substrate 3 may be removed so that the insulating layer 6 is exposed.

Figure 13A:
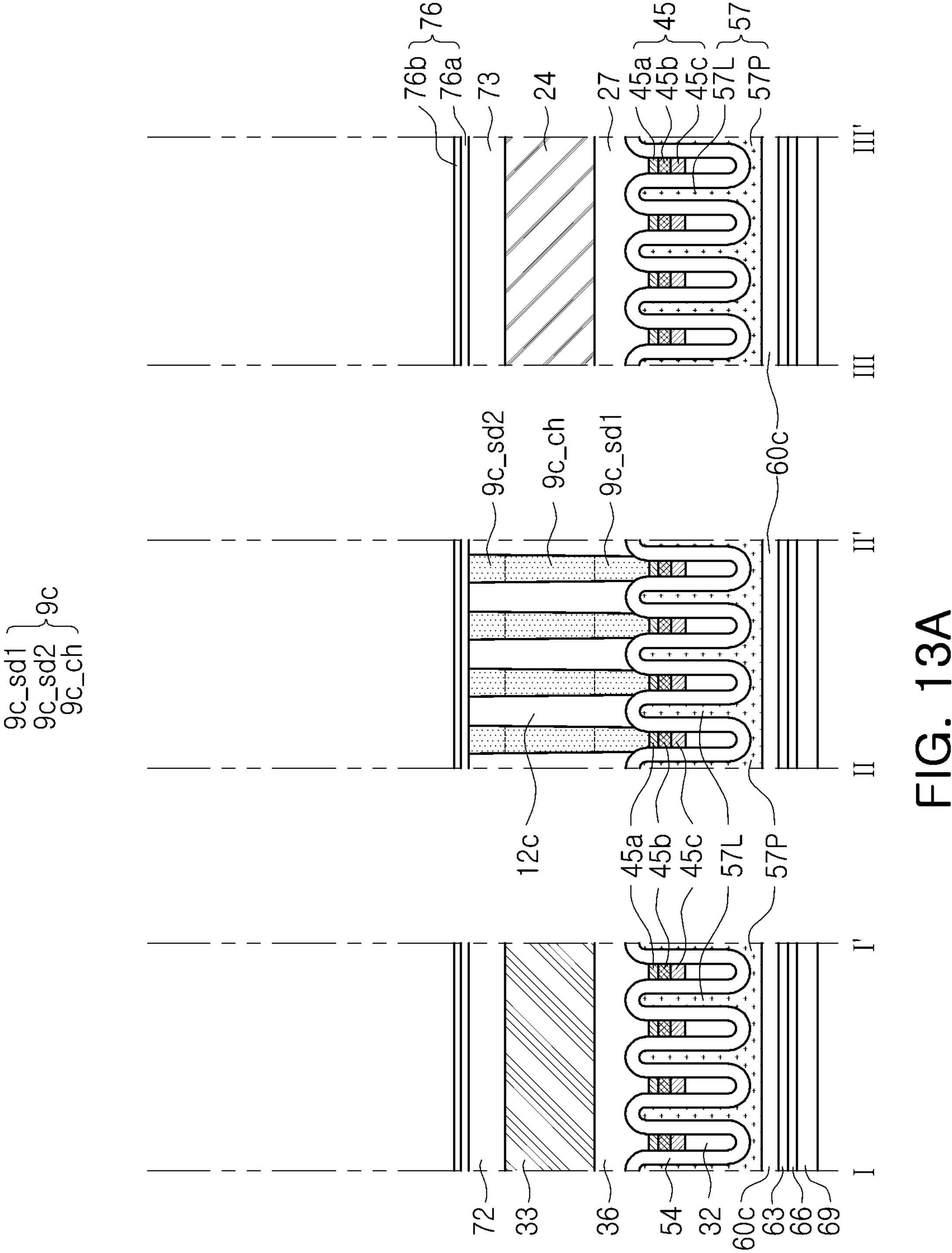
Figure 13B:
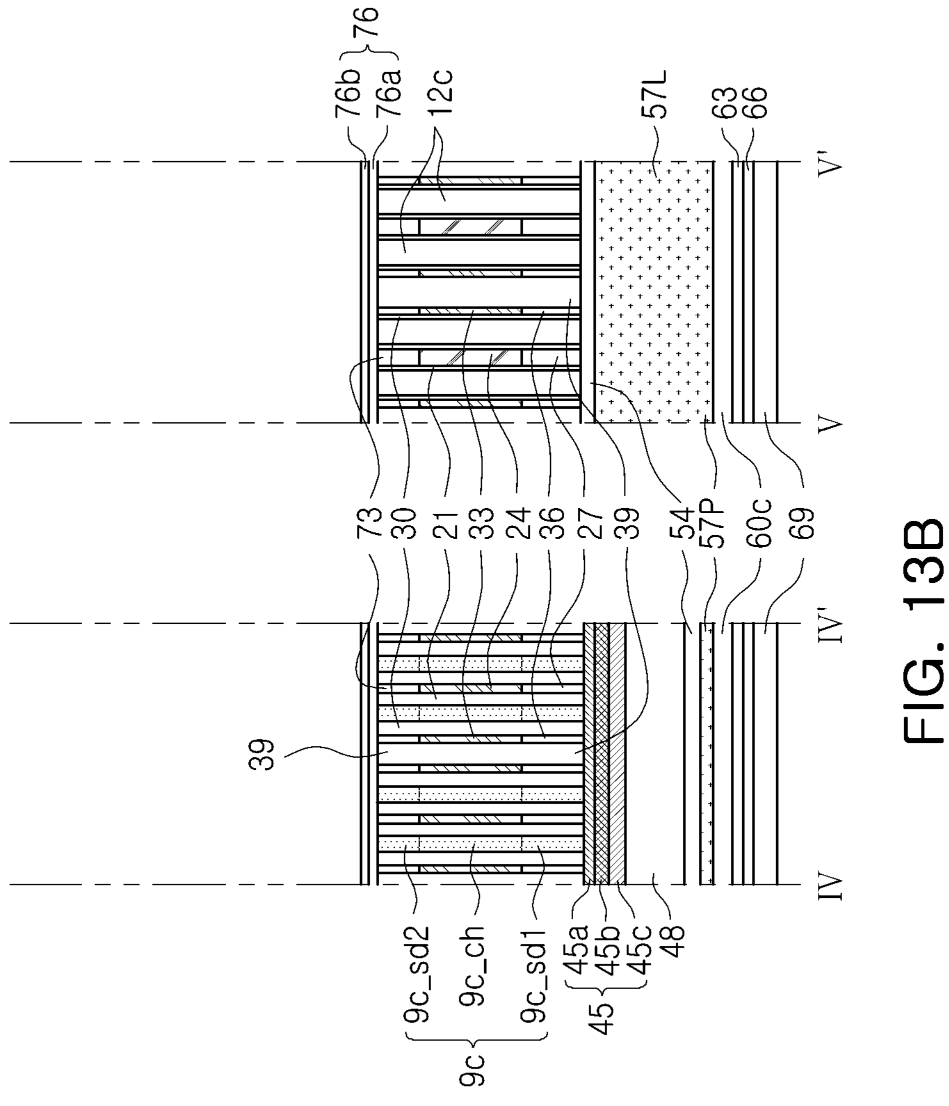
Figure 13C:
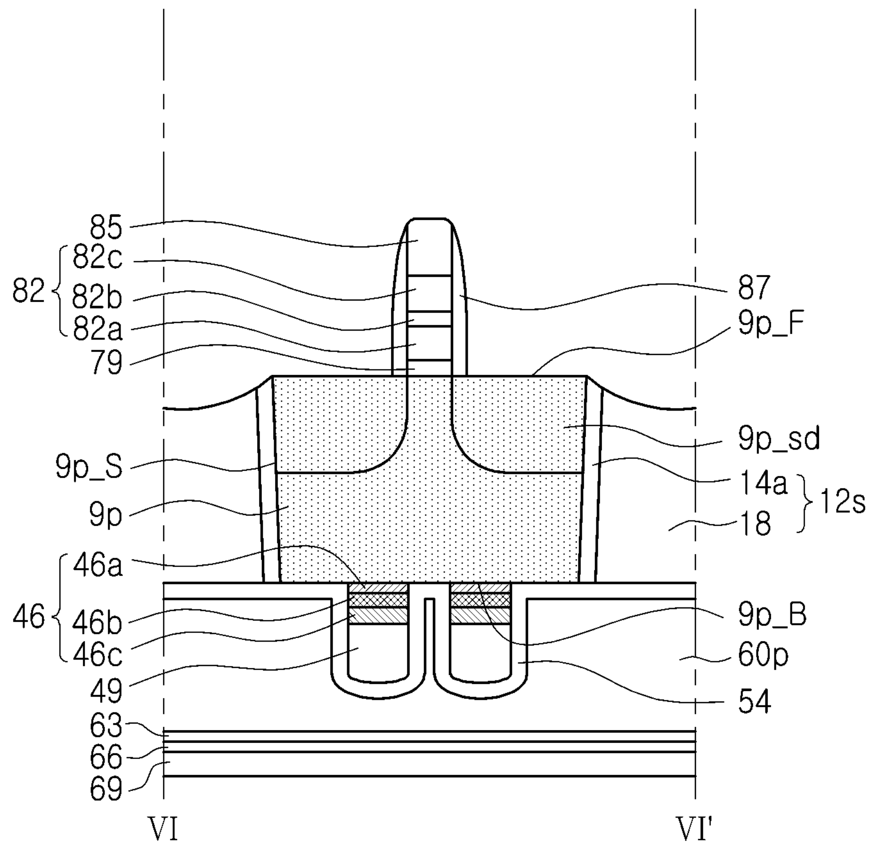
Figure 14A:
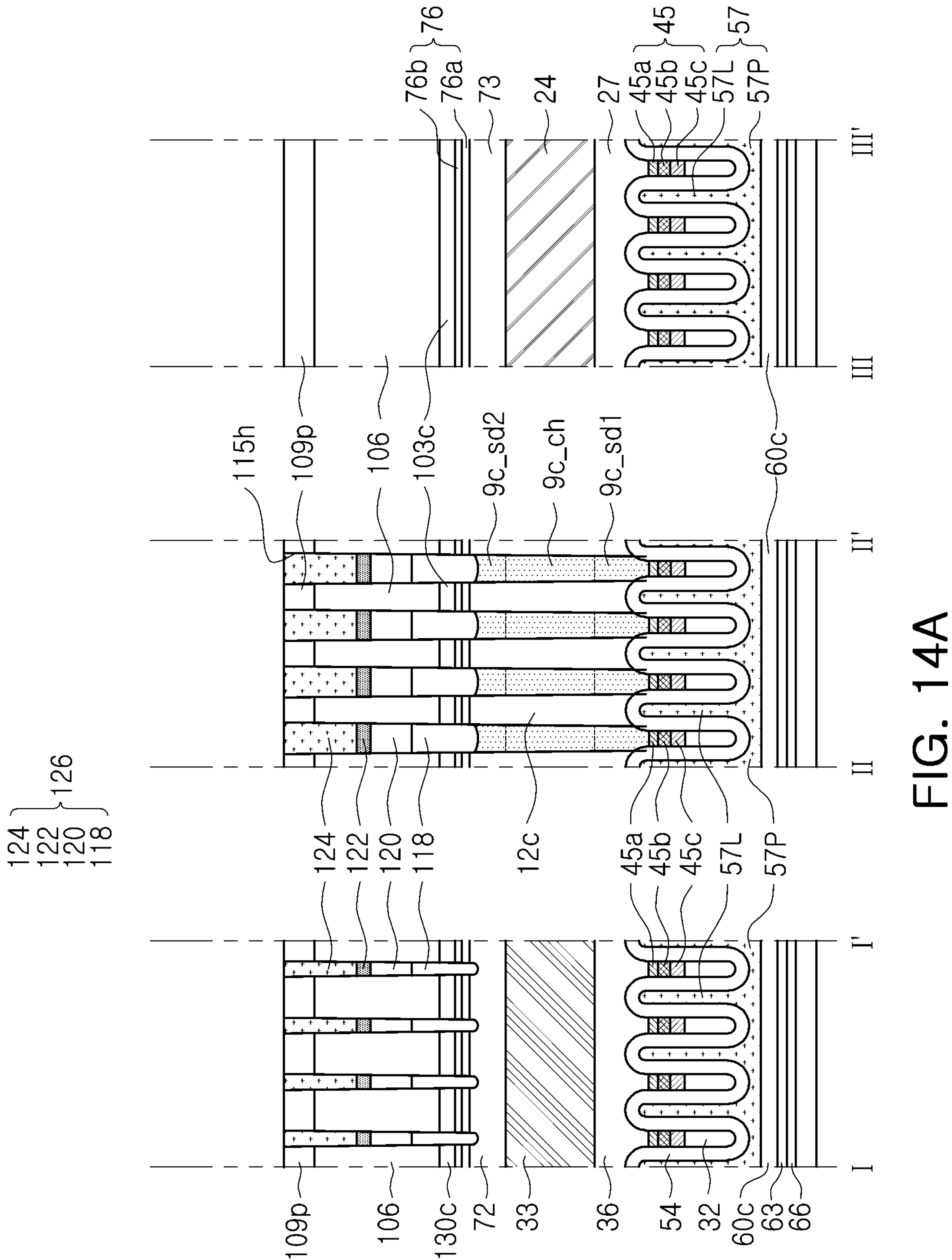
Figure 14B:
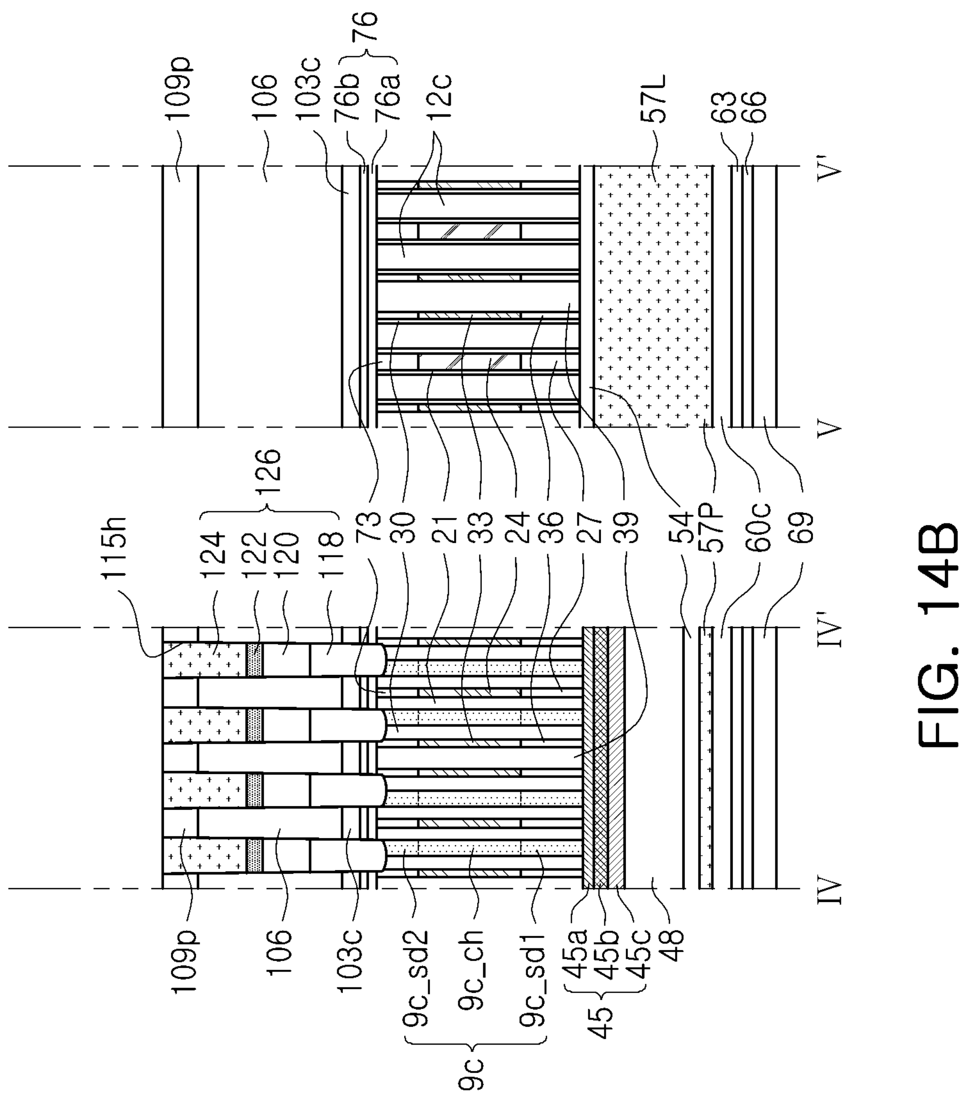
Figure 14C:
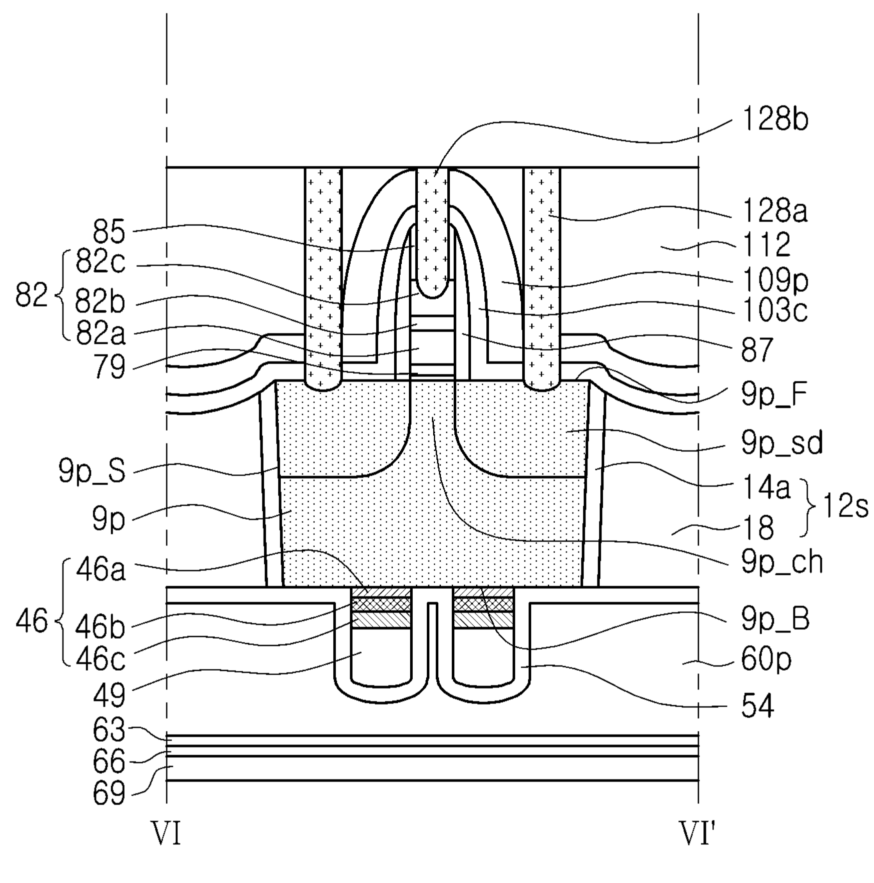

Referring to FIG. 4. FIG. 13A, FIG. 13B, and FIG. 13C, a planarization process may be performed. The planarization process may be performed using at least one of a chemical mechanical polishing process or an etch-back process. The planarization process may be performed until the peripheral semiconductor bodies 9*p* and the cell semiconductor bodies 9*c* are exposed. By the planarization process, the insulating layer 6 may be removed, a portion of the insulating liner 14 may be removed, and portions of the preliminary back gate electrode 23 and the preliminary cell gate electrode 32 may be removed.

The preliminary back gate electrode 23 and the preliminary cell gate electrode 32 may be partially etched to form a back gate electrode 24 and a cell gate electrode 33. Upper ends of the back gate electrode 24 and the cell gate electrode 33 may be disposed at a lower level than upper surfaces of the cell semiconductor bodies 9*c*.

An insulating layer 73 within a space formed by partially etching the preliminary back gate electrode 23 and an insulating layer 72 within a space formed by partially etching the preliminary cell gate electrode 32 may be formed.

Second cell source/drain regions 9*c*_sd2 may be formed in upper regions of the cell semiconductor bodies 9*c*. Within each of the cell semiconductor bodies 9*c*, a cell channel region 9*c*_ch may be formed between the first cell source/drain region 9*c*_sd1 and the second cell source/drain region 9*c*_sd2.

The first cell source/drain region 9*c*_sd1, the second cell source/drain region 9*c*_sd2, the cell channel region 9*c*_ch, the cell gate electrode 33, and the cell gate dielectric layer 30 may form a cell transistor. The cell gate electrode 33 may be a word line.

Within the cell array region MCA, a buffer insulating layer 76 may be formed to protect the cell array region MCA. The buffer insulating layer 76 may include at least one layer, for example, a first buffer insulating layer 76*a* and a second buffer insulating layer 76*b*, sequentially stacked.

A peripheral transistor including a peripheral gate 78 and a peripheral source/drain region 9*p*_sd may be formed (S45). The peripheral gate 78 may include a peripheral gate dielectric layer 79 and a peripheral gate electrode 82 on the peripheral gate dielectric layer 79.

Forming the peripheral gate 78 may include forming the peripheral gate dielectric layer 79 and conductive layers 82*a*. 82*b*, and 82*c* on the peripheral semiconductor body 9*p*, forming a peripheral gate capping pattern 85 on the conductive layers 82*a*, 82*b*, and 82*c*, and forming the peripheral gate electrode 82 by etching the conductive layers 82*a*. 82*b*, and 82*c* by an etching process using the peripheral gate capping pattern 85 as an etching mask.

The conductive layers 82*a*, 82*b*, and 82*c* may include a first conductive layer 82*a*, a second conductive layer 82*b*, and a third conductive layer 82*c*, sequentially stacked.

A peripheral gate spacer 87 may be formed on side surfaces of the peripheral gate electrode 82 and the peripheral gate capping pattern 85.

Peripheral source/drain regions 9*p*_sd may be formed in the peripheral semiconductor body 9*p*. Peripheral source/drain regions 9*p*_sd may be formed on sides of the peripheral gate electrode 82. For example, the peripheral source/drain regions 9*p*_sd may be formed in the peripheral semiconductor body 9*p* on opposite sides of the peripheral gate electrode 82.

Referring to FIG. 4, FIG. 14A, FIG. 14B and FIG. 14C, a lower insulating liner layer 103*c* covering the cell array region MCA and the peripheral circuit region PA may be formed. The lower insulating liner layer 103*c* may be an insulating liner.

Within the cell array region MCA, a cell interlayer insulating layer 106 may be formed on the lower insulating liner layer 103*c*. Forming the cell interlayer insulating layer 106 may include forming an insulating layer on the lower insulating liner layer 103*c*, and removing an insulating layer in the peripheral circuit region PA to form an insulating layer remaining in the cell array region MCA.

An upper insulating liner layer 109*p* covering the cell interlayer insulating layer 106 in the cell array region MCA and the lower insulating liner layer 103*c* in the peripheral circuit region PA may be formed. Within the peripheral circuit region PA, a peripheral interlayer insulating layer 112 may be formed on the upper insulating liner layer 109*p*.

Contact structures, including the cell contact structures 126, the peripheral source/drain contact plug 128*a*, and peripheral gate contact plug 128*b* may be formed (S50).

Each of the cell contact structures 126 may be formed in a hole 115*h*. The holes 115*h* may penetrate through the buffer insulating layer 76, the lower insulating liner layer 103*c*, the cell interlayer insulating layer 106, and the upper insulating liner layer 109*p*. The cell contact structures 126 in the holes 115*h* may be electrically connected to the second cell source/drain region 9*c*_sd2.

Each of the cell contact structures 126 may include a first layer 118, a second layer 120, a third layer 122, and a fourth layer 124.

In one example, the first layer 118 may be formed of epitaxial silicon, for example, epitaxial silicon having N-type conductivity. When the first layer 118 is formed of epitaxial silicon, the second layer 120 may be formed of polysilicon, for example, polysilicon having N-type conductivity.

In another example, the first layer 118 may be formed of polysilicon, for example, polysilicon having N-type conductivity. When the first layer 118 is formed of polysilicon, the first layer 118 and the second layer 120 may be formed of a single layer.

The peripheral source/drain contact plug 128*a* may be electrically connected to the peripheral source/drain region 9*p*_sd through the lower insulating liner layer 103*c*, the upper insulating liner layer 109*p*, and the peripheral interlayer insulating layer 112, within the peripheral circuit region PA. The peripheral gate contact plug 128*b* may be electrically connected to the peripheral gate electrode 82 through the lower insulating liner layer 103*c*, the upper insulating liner layer 109*p*, and the peripheral gate capping pattern 85, within the peripheral circuit region PA.

Referring to FIG. 1, FIG. 2A, FIG. 2B, and FIG. 2C, a data storage structure 141 may be formed on the cell contact structures 126 within the cell array region MCA. The data storage structure 141 may include first electrodes 135 electrically connected to the cell contact structures 126, a dielectric layer 137 on the first electrodes 135, and a second electrode 139 on the dielectric layer 137.

An upper insulating layer 143 covering the peripheral interlayer insulating layer 112 may be formed within the peripheral circuit region PA.

As set forth above, according to example embodiments, a cell vertical channel transistor including a vertical channel region in a cell array region may be provided, and a peripheral transistor may be provided including peripheral source/drain regions formed in a peripheral semiconductor body having a width of an upper region that is greater than a width of a lower region in a peripheral circuit region. A semiconductor device including the cell vertical channel transistor and peripheral transistors may have an increased degree of integration, and improved performance.

According to example embodiments, a back gate capable of suppressing or preventing a floating body effect occurring in the vertical channel region of the cell vertical channel transistor may be provided.

According to example embodiments, a shield pattern may serve to screen capacitive coupling between bit lines.

The various beneficial advantages and effects of the present disclosure are not limited to the above description, and will be more easily understood in the process of describing example embodiments of the present disclosure.

While example embodiments have been illustrated and described above, it will be apparent to those skilled in the art that modified examples and variations could be made without departing from the scope of the present disclosure as defined by the appended claims.

What is claimed is:

1. A semiconductor device, comprising:
- a lower structure including a bit line;
- a cell semiconductor body on the lower structure and vertically overlapping the bit line;
- a peripheral semiconductor body on the lower structure, the peripheral semiconductor body including a portion disposed at a same level as at least a portion of the cell semiconductor body; and
- a peripheral gate on the peripheral semiconductor body,
- wherein the peripheral semiconductor body includes a lower region having a first width and an upper region having a second width,
- wherein the upper region is on the lower region, and
- wherein the second width is greater than the first width.

2. The semiconductor device of claim 1, further comprising:
- a peripheral device isolation region on a side surface of the peripheral semiconductor body; and
- a peripheral insulating structure in contact with an upper surface of the peripheral device isolation region,
- wherein the peripheral device isolation region includes:
  - a gap-fill insulating layer; and
  - a buffer liner between the side surface of the peripheral semiconductor body and a side surface of the gap-fill insulating layer.

3. The semiconductor device of claim 2, wherein an upper end portion of the buffer liner and an upper surface of the gap-fill insulating layer are in contact with the peripheral insulating structure, and a lower end portion of the buffer liner and a lower surface of the gap-fill insulating layer are in contact with the lower structure.

4. The semiconductor device of claim 2, wherein the buffer liner further includes a portion extending between an upper surface of the gap-fill insulating layer and the peripheral insulating structure.

5. The semiconductor device of claim 4, wherein the peripheral device isolation region further includes an insulating liner between the buffer liner and the gap-fill insulating layer.

6. The semiconductor device of claim 5, wherein a material of the insulating liner is different than a material of the buffer liner and a material of the gap-fill insulating layer.

7. The semiconductor device of claim 2, wherein the peripheral device isolation region further includes an insulating liner, wherein the insulating liner is disposed between the side surface of the gap-fill insulating layer and the buffer liner, and disposed between an upper surface of the gap-fill insulating layer and the peripheral insulating structure.

8. The semiconductor device of claim 7, wherein an upper end portion of the buffer liner and an upper end portion of the insulating liner are at a level lower than a level of an upper surface of the peripheral semiconductor body.

9. The semiconductor device of claim 7, wherein an upper end portion of the buffer liner is at a level lower than a level of an upper end portion of the insulating liner.

10. The semiconductor device of claim 1, wherein the peripheral semiconductor body and the cell semiconductor body include single crystal silicon.

11. The semiconductor device of claim 1, wherein the peripheral gate includes:

a peripheral gate dielectric layer in contact with an upper surface of the peripheral semiconductor body; and a peripheral gate electrode on the peripheral gate dielectric layer.

12. The semiconductor device of claim 1, further comprising:

a word line facing a first side surface of the cell semiconductor body; and a back gate electrode facing a second side surface of the cell semiconductor body, wherein the back gate electrode is parallel to the word line, and wherein at least a portion of the cell semiconductor body is disposed between the word line and the back gate electrode.

13. A semiconductor device, comprising:

a lower structure;

a vertical channel transistor on the lower structure;

a peripheral semiconductor body on the lower structure;

a peripheral device isolation region on the lower structure and on a side surface of the peripheral semiconductor body;

a peripheral gate on an upper surface of the peripheral semiconductor body; and peripheral source/drain regions in the peripheral semiconductor body on both sides of the peripheral gate, wherein the vertical channel transistor includes:

a lower cell source/drain region disposed in a lower region of a cell semiconductor body;

an upper cell source/drain region in an upper region of the cell semiconductor body;

a cell channel region in the cell semiconductor body between the lower cell source/drain region and the upper cell source/drain region;

a cell gate electrode facing a first side surface of the cell channel region; and a cell gate dielectric layer between the first side surface of the cell channel region and the cell gate electrode, wherein the lower structure includes a lower insulating layer and a bit line electrically connected to the lower cell source/drain region, wherein the peripheral device isolation region includes a gap-fill insulating layer and a buffer liner between a side surface of the peripheral semiconductor body and a side surface of the gap-fill insulating layer, wherein a lower surface of the gap-fill insulating layer and a lower end portion of the buffer liner are in contact with the lower insulating layer of the lower structure.

14. The semiconductor device of claim 13, wherein a width of the upper surface of the peripheral semiconductor body is greater than a width of a lower surface of the peripheral semiconductor body.

15. The semiconductor device of claim 13, further comprising:

a peripheral insulating structure in contact with an upper surface of the peripheral device isolation region, wherein an upper end portion of the buffer liner of the peripheral device isolation region is in contact with the peripheral insulating structure.

16. The semiconductor device of claim 15, wherein the peripheral device isolation region further includes an insulating liner disposed between the side surface of the gap-fill insulating layer and the buffer liner, and disposed between an upper surface of the gap-fill insulating layer and the peripheral insulating structure.

17. The semiconductor device of claim 13, further comprising:

a contact structure on the upper cell source/drain region and electrically connected to the upper cell source/drain region; and a data storage structure on the contact structure and electrically connected to the contact structure.

18. A semiconductor device, comprising:

a lower structure;

a vertical channel transistor disposed on the lower structure;

a peripheral semiconductor body disposed on the lower structure, at least a portion of a side surface of the peripheral semiconductor body having a negative slope; and a peripheral device isolation region on the side surface of the peripheral semiconductor body, on the lower structure, wherein the vertical channel transistor includes:

a lower cell source/drain region in a lower region of a cell semiconductor body;

an upper cell source/drain region in an upper region of the cell semiconductor body;

a cell channel region in the cell semiconductor body between the lower cell source/drain region and the upper cell source/drain region;

a cell gate electrode facing a first side surface of the cell channel region; and a cell gate dielectric layer between the first side surface of the cell channel region and the cell gate electrode, wherein the lower structure includes:

a bit line electrically connected to the lower cell source/drain region of the vertical channel transistor; and a shield structure including a line portion disposed between the bit line and an adjacent bit line, wherein the peripheral device isolation region includes:

a gap-fill insulating layer; and an insulating liner between the side surface of the peripheral semiconductor body and a side surface of the gap-fill insulating layer, wherein an upper end portion of the peripheral semiconductor body is at a first height level, a lower end portion of the peripheral semiconductor body is at a second height level, an upper end portion of the insulating liner is at a third height level, and a lower end portion of the insulating liner is at a fourth height level, wherein a first difference between the first height level and the third height level is different from a second difference between the second height level and the fourth height level.

19. The semiconductor device of claim 18, wherein the first difference between the first height level and the third height level is greater than the second difference between the second height level and the fourth height level.

20. The semiconductor device of claim 19, further comprising:

a peripheral gate on an upper surface of the peripheral semiconductor body;

peripheral source/drain regions in the peripheral semiconductor body on sides of the peripheral gate;

a peripheral insulating structure in contact with an upper surface of the peripheral device isolation region;

a contact structure on the upper cell source/drain region and electrically connected to the upper cell source/drain region;

a data storage structure on the contact structure and electrically connected to the contact structure; and a lower insulating layer between the shield structure and the bit line, wherein the shield structure further includes a plate portion extending from the line portion and disposed below the bit line.

* * * * *